US010757743B2

(12) United States Patent
Tujkovic et al.

(10) Patent No.: US 10,757,743 B2
(45) Date of Patent: Aug. 25, 2020

(54) PACKET DETECTION IN POINT-TO-POINT WIRELESS COMMUNICATION NETWORKS

(71) Applicant: Facebook, Inc., Menlo Park, CA (US)

(72) Inventors: Djordje Tujkovic, Mountain View, CA (US); Krishna Gomadam, San Jose, CA (US); Vish Ponnampalam, Palo Alto, CA (US)

(73) Assignee: Facebook, Inc., Menlo Park, CA (US)

( * ) Notice: Subject to any disclaimer, the term of this patent is extended or adjusted under 35 U.S.C. 154(b) by 119 days.

(21) Appl. No.: 16/174,651

(22) Filed: Oct. 30, 2018

(65) Prior Publication Data
US 2019/0069332 A1 Feb. 28, 2019

Related U.S. Application Data

(63) Continuation of application No. 15/382,685, filed on Dec. 18, 2016, now Pat. No. 10,149,337, which is a
(Continued)

(51) Int. Cl.
*H03G 3/00* (2006.01)
*H04B 10/294* (2013.01)
(Continued)

(52) U.S. Cl.
CPC .............. *H04W 76/14* (2018.02); *H03G 3/00* (2013.01); *H04B 1/1027* (2013.01);
(Continued)

(58) Field of Classification Search
CPC .......... H03G 3/20; H03G 3/3078; H03G 3/00; H04B 1/1027; H04B 1/109; H04B 1/126;
(Continued)

(56) References Cited

U.S. PATENT DOCUMENTS 8,830,917 B1 9/2014 Zhang et al.
8,891,592 B1 11/2014 Zhang et al.
(Continued)

FOREIGN PATENT DOCUMENTS

CH 103763062 4/2014
WO WO2006039936 4/2002

OTHER PUBLICATIONS

PCT/US2016/067861; PCT International Search Report, dated Mar. 30, 2017.
(Continued)

*Primary Examiner* — Harun Chowdhury
(74) *Attorney, Agent, or Firm* — Brian R. Short

(57) ABSTRACT

Methods, apparatuses, and systems for packet detection in a point-to-point wireless communication network is disclosed. One method includes receiving, by a receiving node, a plurality of packets, adjusting, by an adjustable gain amplifier of the receiving node, a power level of the received plurality of packets, controlling, by a gain control module, a gain of the adjustable gain amplifier, thereby controlling the power level of the received plurality of packets, monitoring the controlled gain of the gain control module over a period of time, identifying a timing of reception of interfering packets based on the monitoring of the controlled gain of the gain control module over the period of time, and adjustably controlling, by the gain control module, the gain of the adjustable gain amplifier based on the identified timing of reception of the interfering packets.

20 Claims, 20 Drawing Sheets

Related U.S. Application Data continuation-in-part of application No. 15/248,297, filed on Aug. 26, 2016, now Pat. No. 10,193,648, and a continuation-in-part of application No. 15/248,378, filed on Aug. 26, 2016, now Pat. No. 10,177,870.

(60) Provisional application No. 62/273,993, filed on Dec. 31, 2015.

(51) Int. Cl.

| | | |
|---|---|---|
| *H04W 76/14* | (2018.01) | |
| *H04K 3/00* | (2006.01) | |
| *H04W 28/04* | (2009.01) | |
| *H04L 27/26* | (2006.01) | |
| *H04L 25/02* | (2006.01) | |
| *H04B 1/10* | (2006.01) | |
| *H04L 25/03* | (2006.01) | |

(52) U.S. Cl.
CPC ......... *H04B 10/2942* (2013.01); *H04K 3/825* (2013.01); *H04L 25/0226* (2013.01); *H04L 27/2692* (2013.01); *H04W 28/04* (2013.01); *H04L 2025/03789* (2013.01); *H04L 2025/03796* (2013.01)

(58) Field of Classification Search
CPC ..... H04B 10/2942; H04L 1/205; H04L 1/206; H04L 27/3809
USPC ........................ 370/252, 328, 329; 455/232.1
See application file for complete search history.

(56) References Cited

U.S. PATENT DOCUMENTS

| | | | |
|---|---|---|---|
| 9,264,280 B1* | 2/2016 | Waheed | ............... H04L 27/3809 |
| 9,332,514 B2 | 5/2016 | Sorin | |
| 2001/0044278 A1 | 11/2001 | Chiao et al. | |
| 2005/0111401 A1* | 5/2005 | Terry | ................... H03G 3/3078 370/328 |
| 2007/0168841 A1 | 7/2007 | Lakkis | |
| 2009/0103648 A1 | 4/2009 | Fukuoka et al. | |
| 2009/0110031 A1 | 4/2009 | Lakkis | |
| 2010/0054223 A1 | 3/2010 | Zhang et al. | |
| 2011/0110454 A1 | 5/2011 | Sampath et al. | |
| 2011/0122795 A1* | 5/2011 | Hwang | ................... H04L 1/206 370/252 |
| 2011/0209035 A1 | 8/2011 | Lakkis | |
| 2012/0214403 A1 | 8/2012 | Shany et al. | |
| 2014/0206279 A1 | 7/2014 | Immendorf et al. | |
| 2015/0043522 A1 | 2/2015 | Mobasher et al. | |
| 2015/0237178 A1 | 8/2015 | Zhang | |
| 2015/0303959 A1* | 10/2015 | Chen | ....................... H03G 3/20 455/232.1 |
| 2016/0241425 A1 | 8/2016 | Xin | |
| 2016/0308635 A1 | 10/2016 | Zhou | |
| 2016/0381565 A1 | 12/2016 | Oteri | |
| 2017/0105229 A1* | 4/2017 | Luo | ....................... H04L 5/0044 |

OTHER PUBLICATIONS

PCT/US2016/067861; Written Opinion of the International Searching Authority, dated Mar. 30, 2017.

* cited by examiner

Constructing, by a sector of a transmitting node, a packet including data that is to be transmitted to a receiving node in the wireless network, wherein the constructed packet includes a short training field, a channel estimation field, a header field, and a data payload

610

Transmitting by the sector of the transmitting node, a jamming code before the short training field of the constructed packet, thereby reducing a likelihood that the receiving node will decode a different short training field of an interfering packet before the receiving node decodes the short training field of the constructed packet

Table 1810

| Assignment | Total Links | Links with 1 EW Interferer | Links with 2+ EW Interferer | Links with 3+ EW Interferer |
|---|---|---|---|---|
| standard 11ad | 2360 | 134 | 62 | 1 |

Table 1820    2 Golay Codes

| Assignment | Total Links | Links with 1 EW Interferer | Links with 2+ EW Interferer | Links with 3+ EW Interferer |
|---|---|---|---|---|
| Link-based | 2360 | 65 | 1 | 0 |
| Node-based | 2360 | 65 | 4 | 0 |

Table 1830    3 Golay Codes

| Assignment | Total Links | Links with 1 EW Interferer | Links with 2+ EW Interferer | Links with 3+ EW Interferer |
|---|---|---|---|---|
| Link-based | 2360 | 18 | 0 | 0 |
| Node-based | 2360 | 21 | 1 | 0 |

Table 1840    4 Golay Codes

| Assignment | Total Links | Links with 1 EW Interferer | Links with 2+ EW Interferer | Links with 3+ EW Interferer |
|---|---|---|---|---|
| Link-based | 2360 | 17 | 1 | 0 |
| Node-based | 2360 | 17 | 1 | 0 |

FIGURE 18

PACKET DETECTION IN POINT-TO-POINT WIRELESS COMMUNICATION NETWORKS

RELATED APPLICATIONS

This patent application is a continuation of U.S. patent application Ser. No. 15/382,685, filed Dec. 18, 2016, which claims priority to U.S. Provisional Patent Application Ser. No. 62/273,993, filed Dec. 31, 2015, and which is a CIP (continuation-in-part) of U.S. patent application Ser. No. 15/248,297, filed Aug. 26, 2016, and a CIP (continuation-in-part) of U.S. patent application Ser. No. 15/248,378, filed Aug. 26, 2016.

TECHNICAL FIELD

The present disclosure relates generally to wireless communication networks and in particular to methods of minimizing the detection of interfering packets in a wireless communication network.

BACKGROUND

Most Internet Protocol (IP) traffic is carried on fiber optic or cable networks. This works well when the cable infrastructure is already present or can be easily installed. However, there are many locations where it is either not practical or too expensive to dig up streets or run cables overhead. To alleviate this problem, wireless networks have been proposed to extend the reach of the communication network to locations that cannot be connected by physical cables. Moreover, wireless networks are generally much easier to reconfigure, e.g. to handle changes in data communication traffic.

In some wireless networks that have multiple protocol receivers, a data communications protocol can identify intended receivers. However, other protocols do not provide a capability to target a particular receiver. When no targeting is available, some receivers may miss some packets because they are listening to packets directed at other receivers.

SUMMARY

An embodiment includes a method. The method includes receiving, by a receiving node, a plurality of packets, adjusting, by an adjustable gain amplifier of the receiving node, a power level of the received plurality of packets, controlling, by a gain control module, a gain of the adjustable gain amplifier, thereby controlling the power level of the received plurality of packets, monitoring the controlled gain of the gain control module over a period of time, identifying a timing of reception of interfering packets based on the monitoring of the controlled gain of the gain control module over the period of time, and adjustably controlling, by the gain control module, the gain of the adjustable gain amplifier based on the identified timing of reception of the interfering packets.

An embodiment includes a node. The transmitting node includes an RF (radio frequency) chain operative to receive a plurality of packets, an adjustable gain amplifier operative to adjust a power level of the received plurality of packets, a gain control module operative to control a gain of the adjustable gain amplifier, thereby controlling the power level of the received plurality of packets, and a controller operative to monitor the controlled gain of the gain control module over a period of time. A timing of reception of interfering packets is identified based on the monitoring of the controlled gain of the gain control module over the period of time, and the gain control module adjustably controls the gain of the adjustable gain amplifier based on the identified timing of reception of the interfering packets.

BRIEF DESCRIPTION OF THE DRAWINGS

FIG. 6 is a flow chart that includes acts of a method for use in a wireless communication network, according to an embodiment.

FIG. 18 shows test results of packet interference within a wireless network for different reference code selections, according to an embodiment.

DETAILED DESCRIPTION

Embodiments introduced herein improve the detection of packets in a point-to-point wireless communication network.

In some embodiments, packets that are transmitted on the network include a training field that a receiver uses to synchronize itself to an incoming packet. To prevent a receiver from locking on to the training field of an interfering packet, packets are sent with a jamming signal that precedes the training field of the packet. The jamming signal prevents a receiver from decoding the training field of a packet that was received earlier and which may interfere with the desired packet.

In some embodiments, transmission times in the network are limited to a number of micro-slots in a time division duplex (TDD) or time division multiplex (TDM) frame. Tightly controlling the transmission times limits the maximum time difference of when an interfering and a desired packet can reach a receiving node.

In some embodiments, one or more portions of a packet, such as the short training field or header field of the packet, are encoded in a manner that is specific to an intended receiver. In some embodiments, packets are transmitted on a frequency that is specific to an intended receiver.

Figure 1:
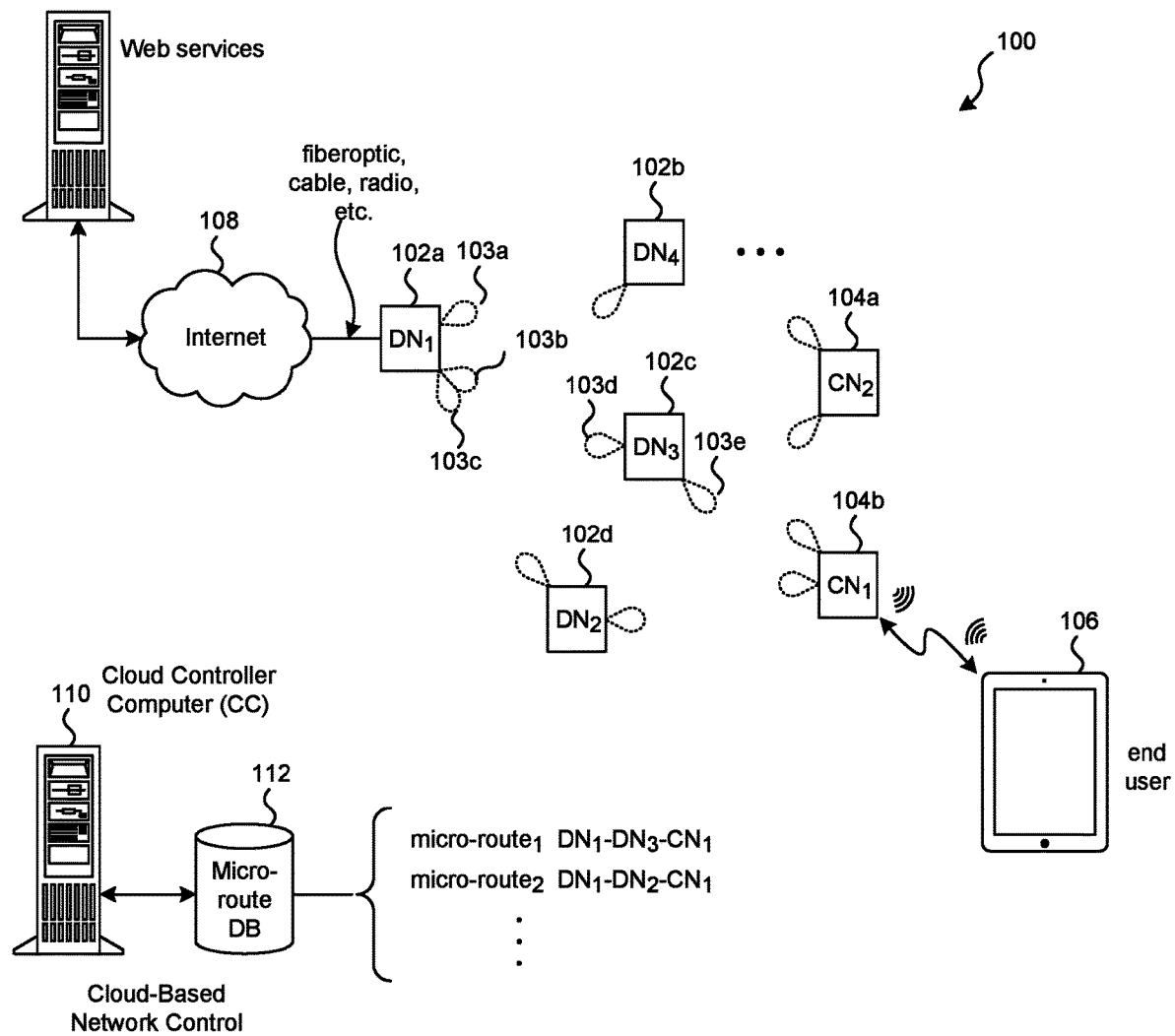
FIG. 1 is a block diagram illustrative of a point-to-point wireless communication network in accordance with an embodiment of the present disclosure.

Turning now to the figures, FIG. 1 shows one embodiment of a point-to-point wireless communication network. The network 100 includes a number of destination nodes (DN) 102a, 102b, 102c, 102d, etc., and a number of client nodes (CN) 104a, 104b, etc. The destination nodes transmit IP packets between themselves and the client nodes. Each node includes one or more antennas, a radio frequency transceiver for sending and receiving signals and a beamformer (for example, an array of antennas that are directionally controlled) for selectively changing the effective transmit and receive directions of the signals transmitted and received. The nodes also include one or more processors that execute programmed instructions to transmit packets between the nodes or to and from a computer communication link. The client nodes transmit and receive IP packets between themselves and the destination nodes as well as to a number of end users 106 (including, but not limited to, wireless enabled devices such as computers, tablets, smart phones, household appliances, or any other device capable of transmitting and receiving wireless IP data). For at least some embodiments, the destination nodes 102 are mounted on utility poles or on buildings and transmit point-to-point wireless signals approximately 200-300 meters, depending on the conditions. The client nodes 104 are generally located in retail/office establishments or in homes to transmit and receive IP packets to and from the end users. In some embodiments, the IP packets are sent according to a standardized protocol such as IEEE 802.11ad. However, it will be appreciated that any number of other IP protocols, such as WiMAX 802.16, could be used.

In the network 100, at least one destination node (e.g., node 102a) is coupled to a physical cable that carries IP data to and from a computer communication link 108 (e.g., the Internet or a private communication link). IP packets that are destined for an end user 106 are received from the communication link and are transmitted via one or more routes to the client node 104b, which is in communication with the end user 106. For example, packets may be sent via a route including nodes $DN_1 \rightarrow DN_3 \rightarrow CN_1$ or via a second route including nodes $DN_1 \rightarrow DN_2 \rightarrow CN_1$, depending on the radio frequency path conditions that may exist at any time.

In some embodiments, transmissions are carried on a non-regulated 60 GHz radio frequency spectrum band. At these frequencies, the ability to transmit and receive packets is easily influenced by changing atmospheric conditions (wind, rain, etc.) or by interfering objects (e.g., buses, tree limbs, or other objects passing in and out of the line of sight). Therefore, the best route to complete a communication link between a transmitting and a receiving node in the network may change over time.

In the embodiment shown, a cloud controller computer 110 includes a database 112 that stores a list of possible routes that have been determined to complete a communication link between the various nodes of the network. The cloud controller computer 110 can communicate with each of the nodes by sending packets that are addressed to the nodes to control the overall operation of the network. In some embodiments, the cloud controller computer 110 periodically updates the list of possible routes based on information received from the various nodes in the system regarding channel conditions.

To improve the communication path between each of the nodes, to reduce interference, and to increase the throughput of the network, the destination and client nodes generally include multiple antennas that can be used to control the transmit and receive directions of the node by employing beamforming techniques. As will be appreciated by those skilled in the art of radio frequency communications, the radio frequency signals transmitted by each of the antennas can be selectively timed by beamforming techniques to direct the main lobe (which can comprise the bulk of the transmitted signal power) in a desired direction. Similarly, signals received by the antennas can be delayed and summed using beamforming techniques to change the effective listening direction of the receiver. In the embodiment shown in FIG. 1, destination node $DN_1$ 102a can beamform its transmitted and received signals in several different directions 103a, 103b, 103c. Similarly, destination node $DN_3$ 102c can beamform its transmitted and received signals in directions 103d and 103e.

In some embodiments, a node will receive more than one packet at a time. The presence of interfering packets inhibits the ability of a node to accurately decode a desired packet. This problem is particularly acute in time domain duplex or time domain multiplex point-to-point wireless networks where a common "training field" precedes each packet. In this case, the training field does not uniquely identify the intended receiver, and it is possible that an unintended receiver will lock on to an interfering packet and miss a desired packet. Therefore, there is a need for a system that increases the ability of a node to detect a desired packet in the presence of interference.

Figure 2:
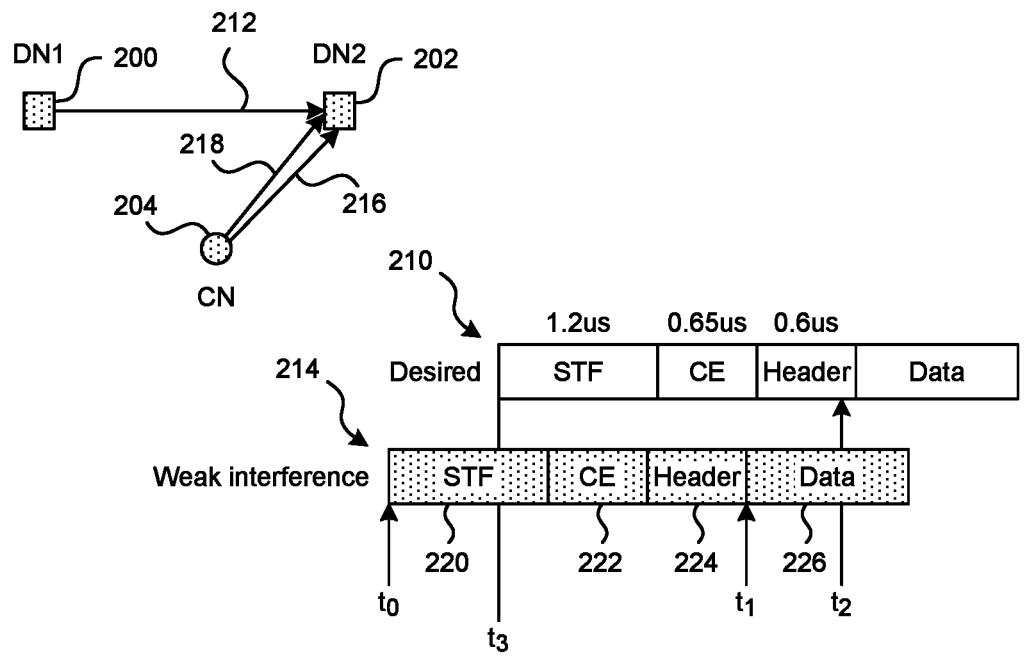
FIG. 2 is a block diagram illustrative of a node that receives a desired packet and an interfering packet.

As discussed above, interfering packets that arrive at a receiving node at nearly the same time as a desired packet inhibit the ability of the receiving node to accurately decode the desired packet. This reduces throughput on the network because signals have to be sent indicating that the desired packet was not received and the missed packet has to be retransmitted. FIG. 2 shows a portion of a communication network including two destination nodes 200, 202 and a client node 204. Each of the nodes includes multiple antenna arrays (not shown) so that the nodes can simultaneously transmit or receive packets in different directions. In this example, destination node 200 sends a desired packet 210 in a direction 212 to a first antenna array used by the destination node 202. At nearly the same time, client node 204 sends a packet 214 in a direction 216 to another antenna array used by the destination node 202. In the example shown, the packet 214 sent from client node 204 also travels in a path 218 so that it arrives at the node 202 before the desired packet 210. Because the antenna array on destination node 202 is not tuned to listen in the direction 218, the packet 214 has a weaker signal power than the signal power of the desired packet 210.

Like other packets transmitted on the network, the interfering packet 214 begins with a short training field (STF) 220, is followed by a channel evaluation (CE) field 222 and a header field 224, and ends with a data portion 226 of the packet. The interfering packet 214 is received at time $t_0$ by an antenna array for the node 202 that is listening in the direction 212. Because the interfering packet 214 arrives at $t_0$ before the desired packet 210 at $t_3$, the receiver in node 202 attempts to lock on to and decode the interfering packet 214. Due to the presence of the stronger desired packet 210 that arrives later, the receiver is unable to decode the header portion of the interfering packet 214 at time $t_1$ or the data portion of the interfering packet at time $t_2$. However, by the time the receiver in node 202 determines that it cannot decode the header field of the interfering packet 214, the short training field of the desired packet 210 has already been transmitted. Therefore, the receiver is also unable to lock on to and decode the desired packet 210.

Figure 3:
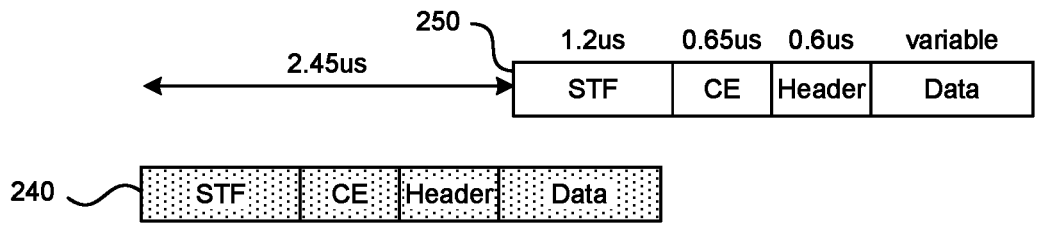
FIG. 3 is a block diagram illustrative of a time period during which a receiving node cannot decode a desired packet in the presence of an interfering packet.

In some cases, if an interfering packet arrives much earlier than the desired packet, the receiving node will be able to determine that it cannot decode the interfering packet and still have time to detect and decode the desired packet. FIG. 3 shows an example of this situation. Here, an interfering packet 240 arrives at the receiving node before a desired packet 250. By the time the receiving node determines that it cannot decode the header portion of the interfering packet, the short training field of the desired packet 250 is just arriving. Even if the receiving node misses a few samples of the STF of the desired packet 250, the receiving node should be able to lock on to the desired packet and decode it. On the other hand, if the interfering packet arrives just before the desired packet (e.g., the interfering packet arrives before the desired packet by an amount that is less than the duration of the STF), the receiver will likely be able to lock on to and decode the STF of the stronger packet. Therefore, there is a time window during which the interfering packet has the greatest potential to prevent the receiver from being able to detect and decode a desired packet.

Figure 4:
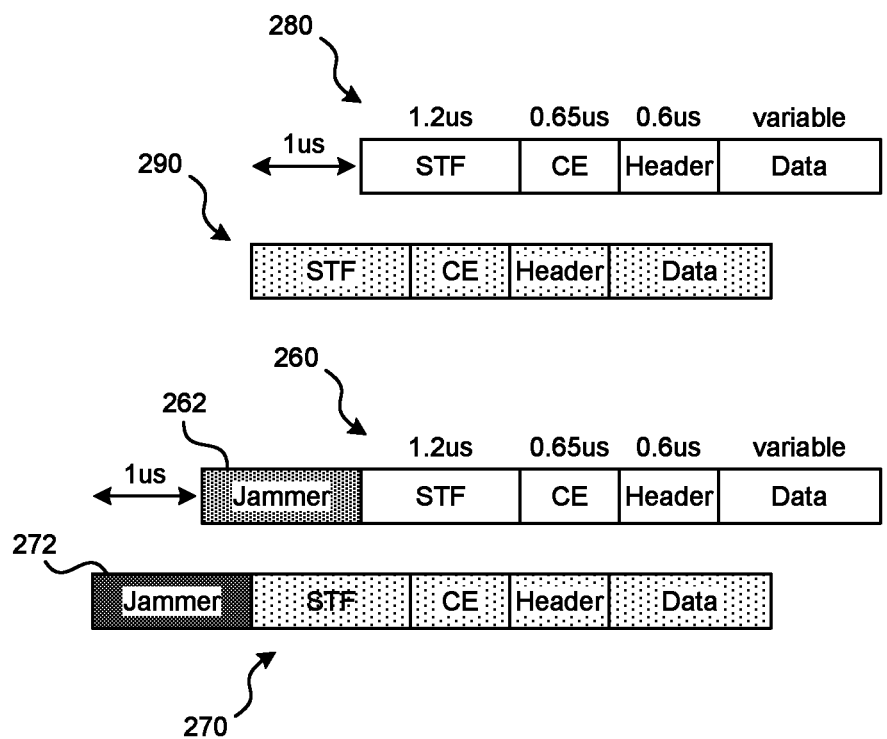
FIG. 4 is a block diagram illustrative of packets transmitted in a point-to-point wireless network with and without jamming signals in accordance with an embodiment of the present disclosure.

FIG. 4 shows one technique for preventing an interfering packet from inhibiting the detection of a desired packet in accordance with the present disclosure. In this embodiment, a desired packet 260 includes a jamming signal code 262 that precedes the short training field of the packet. An interfering packet 270 also includes a jamming signal code 272 that precedes its short training field. The jamming signal code 262 of the desired packet 260 has the purpose of preventing a receiving node from being able to lock on to and decode the short training field of a packet that arrives before the short training field of the desired packet. In the example shown, the jamming signal code 262 prevents a receiver from locking on to the short training field of the interfering packet 270. Because the short training field of the interfering packet is not decoded, the receiver will continue to search for a short training field of a received packet and should be able to detect and decode the desired packet even in the presence of the interfering packet. In contrast, as is also shown in FIG. 4, if a jamming signal is omitted from a desired packet, the receiver will lock on to the short training field of the interfering packet 290 and the receiver will not be able to detect and decode the desired packet 280.

In some embodiments, the jamming signal field can comprise a random sequence or a Golay sequence (sequences with the useful property that their out-of-phase aperiodic autocorrelation coefficients sum to zero) that is selected to interfere with the detection of a short training field. In another embodiment, a training transmit/receive (TRN-T/R) field appended to a previous packet can be used instead of, or in addition to, a short training field. In some embodiments, the jamming signal has a duration that is about the same length as the short training field.

In accordance with another aspect of the disclosure, the problems created by interfering packets can be reduced by tightly controlling when packets are transmitted. In some embodiments, a TDD time slot is divided into multiple micro-slots, each of which is shorter than a TDD time slot. Packets cannot be transmitted at all times during a time slot but must be transmitted at a predetermined one of the micro-slots. Because the time period during which packets are transmitted is tightly controlled, there is less likelihood that packets will be sent at times that cause interference at a receiver. In some embodiments, transmission schedules for when packets should be transmitted from each node are determined by the cloud controller computer 110 shown in FIG. 1. The schedules from the cloud controller computer are transmitted to each node in the network to more tightly control transmissions and lessen the likelihood of interfering transmissions at a receiving node. The receivers in each node subsequently may listen only at times when the desired signals are scheduled to arrive. If the transmission schedule is tightly controlled so that interfering packets do not arrive during the time window when they have the greatest ability to inhibit the detection of a desired packet, there is less likelihood that the receiver will lock on to an interfering packet.

In accordance with some embodiments, nodes in the network include a receiver with an automatic gain control circuit (AGC) that operates according to a programmed algorithm to adjust the gain that is applied to receive signals. In accordance with some embodiments, the AGC of a receiver is lowered during times when a receiver node is not expecting a packet. Therefore, it is less likely that the receiver will detect and lock on to an interfering packet that arrives before a desired packet is expected.

In accordance with another embodiment, packets are addressed to individual receiving nodes to lessen the effect that an interfering packet has at a receiver. In some embodiments, short training fields are composed of Golay 128 bit codes followed by negated Golay 128 bit codes. In some embodiments, packets destined for a particular receiver are defined by a particular sequence of Golay codes (or other training codes). In some embodiments, common training sequences are used until a communication link is established between nodes. A sequence identification is then negotiated for use in further communications between the two nodes. In some embodiments, the cloud controller computer 110 assigns a particular pattern of codes to be used in transmissions to any particular receiver. The codes are forwarded by the cloud controller computer to each of the nodes in the network so that the nodes will know how a packet to a particular receiver should be constructed. In some embodiments, the short training field codes for a particular receiver are selected in a manner that is unique to the receiver. In another embodiment, the codes for a header field are uniquely selected for a particular receiver. In this way, a receiver that receives a packet without the appropriate codes can stop decoding a detected packet and begin listening for another packet on the wireless network.

If a receiver is able to decode the header field of an interfering packet, the receiver can be blocked for the entire length of a packet. Therefore, in accordance with another embodiment of the disclosure, the header field of a packet is scrambled, encrypted or encoded so that it can be decoded only by the intended receiver. A receiver that detects a packet can attempt to unscramble the header portion. If the header cannot be unscrambled or decoded, then the receiver stops processing the received packet and begins searching for new short training fields that mark the beginning of a new packet.

In some embodiments, the programming of the AGC is adjusted according to a measured or expected link quality. With the AGC reduced, lower strength interference signals are less likely to be detected. In yet another embodiment, a receiver runs both packet detection and packet processing operations in parallel. If a new packet with a short training field is detected with a better signal-to-noise ratio or other reception metric compared with the packet that is being processed, then the receiver can eject the packet being processed in favor of the newly detected packet.

In a manner that is similar to specifically addressing packets to individual receivers, the transmit frequency on which a receiver detects signals can be made specific to the particular receiver. In some embodiments, a carrier frequency can be adjusted by a few parts per million (ppm) in a manner that is specific to a particular receiver. Packets that are to be directed to the particular receiver are sent on the receiver-specific frequency.

As will be appreciated by those skilled in the art, the present disclosure describes a number of techniques that can be used to lessen the likelihood that an interfering packet will prevent the detection and decoding of a desired packet. The techniques can be used alone or in combination in transmitting and receiving nodes to increase the ability of a receiving node to detect desired packets.

In some embodiments, the nodes of the network include a processor, a transceiver for transmitting and receiving wireless signals, and an antenna. At least some of the nodes in the network include multiple antennas in a linear or two-dimensional array that allows the node to change its transmit and receive directions by beamforming. A memory in the node stores program instructions that are executable by the processor to determine or read directions in which signals should be transmitted from the node. A beamformer in the node is controllable by the processor to change the direction at which signals are transmitted by the node in order to complete a communication link with another node in the network.

In some embodiments, each node includes a processor and a memory unit that stores a routing table with preferred beamforming directions in order to communicate with other nodes in the network. When a node receives a packet to be transmitted to an intended receiving node, the processor looks up the beamforming directions and adjusts transmit beamforming as required to direct the transmissions toward the intended receiving node.

In another embodiment, the cloud controller computer stores beamforming information to be used by the various nodes in a network. When a packet is to be transmitted between nodes in the network, the beamforming information is included in overhead information that is transmitted to the nodes so that each node will know the preferred beamforming orientation.

An embodiment includes a node for use in a wireless communication network. The node includes a transceiver, a beamformer (such as, an array of antennas that are directionally controllable) that is configured to beamform signals transmitted by an antenna array, a processor; and a memory. For an embodiment, the memory is for storing program instructions that are executable by the processor to construct a packet including data that is to be transmitted to another node in the wireless network, wherein the constructed packet includes a short training field, a channel estimation field, a header field and a data payload, wherein the instructions further include instructions that cause the processor to encode one or more of the short training field or the header field in a manner that is specific to an intended receiver. For an embodiment, the transceiver is configured to transmit the constructed packet on a frequency (carrier frequency) that is specific to the receiving node.

An embodiment includes a node for use in a wireless communication network. The node includes a transceiver, a beamformer that is configured to beamform signals received by an antenna array, a processor; and a memory. For an embodiment, the memory is for storing program instructions that are executable by the processor to search incoming signals to detect a short training field of a first received packet, analyze the first packet associated with the detected short training field for data, and continue to search incoming signals to detect a short training field of a second packet concurrently while analyzing the first packet, and in an event the short training field associated with the second packet is detected with a better signal strength than a signal strength associated with the first packet, stop analyzing the first packet and begin analyzing the second packet.

An embodiment includes a computer-readable storage medium of a node in a point-to-point wireless communication network storing instructions. For an embodiment, the instructions include instructions for constructing a packet including data that is to be transmitted to the receiving node in the wireless network, wherein the constructed packet includes a short training field, a channel estimation field, and a data payload, and instructions for transmitting a jamming code before the constructed packet to reduce a likelihood that the receiving node will decode a short training field of an interfering packet before the receiving node decodes the short training field of the constructed packet.

For an embodiment, the instructions include instructions for pre-appending the jamming code to the constructed packet before the constructed packet is transmitted. For an embodiment, the instructions include instructions for transmitting the jamming code as part of a packet that is transmitted before the constructed packet is transmitted. For an embodiment, the instructions include instructions for encoding the short training field in the constructed packet to uniquely address the receiving node.

An embodiment includes a method of operating a node in a point-to-point wireless communication network to transmit information to an intended receiving node in the wireless network, including constructing a packet including data that is to be transmitted to the intended receiving node in the wireless network, wherein the constructed packet includes a short training field, a channel estimation field, a header field and a data payload, encoding one or more of the short training field or the header field in a manner that is specific to the intended receiving node, and transmitting to the intended receiving node the constructed packet. For an embodiment, the method further includes transmitting one or more packets to the intended receiving node with un-encoded short training fields to set up a communication link, and after the communication link is established, determining an encoding for the short training field and/or the header field in a manner specific to the receiving node.

An embodiment includes a method of a node in a point-to-point wireless communication network to transmit information to a receiving node in the wireless network. The method includes constructing a packet including data that is to be transmitted to the receiving node in the wireless network, wherein the constructed packet includes a short training field, a channel estimation field, a header field, and a data payload, determining a frequency offset for packets to be sent to the receiving node, and transmitting using the frequency offset the constructed packet to the receiving node.

An embodiment includes a method of operating a node in a point-to-point wireless communication network to transmit information to a receiving node in the wireless network. The method includes constructing a packet including data that is to be transmitted to the receiving node in the wireless network, wherein the constructed packet includes a short training field, a channel estimation field, a header field, and a data payload, determining a time at which the constructed packet is to be sent to the receiving node, wherein the time is one of a number of a micro-slots that together comprise a time slot in a TDD/TDM transmission system, and transmitting during the determined micro-slot, the constructed packet to the receiving node. For an embodiment, the method further includes encoding one or more of the short training field and the header field in a manner that is specific to the receiving node. For an embodiment, the method further includes transmitting one or more packets to the receiving node with un-encoded short training fields to set up a communication link and once the communication link is established, determining an encoding for the short training field and/or the header field in a manner specific to the receiving node.

An embodiment includes a node for use in a wireless communication network. The node includes an antenna array, a transceiver coupled to receive signals from the antenna array, a beamformer that is configured to beamform signals received by the antenna array, an automatic gain control circuit (AGC) that is configured to adjust a gain applied to signals received by the antenna array a processor; and a memory. For an embodiment, the memory stores program instructions that are executable by the processor to determine a time slot when signals that are intended for the node are expected to be received by the antenna array and to control the AGC circuit to lower the gain applied to signals received by the antenna at times when signals are not expected to be received. For an embodiment, the memory further stores instructions that are executable by the processor to search incoming signals to detect a short training field of a first received packet, analyze the first packet associated with the detected short training field for data; and continue to search incoming signals to detect a short training field of a second packet as the first packet is being analyzed and in an event the short training field associated with the second packet is detected with a better signal strength than a signal strength associated with the first packet, stop analyzing the first packet and begin analyzing the second packet.

Figure 5:
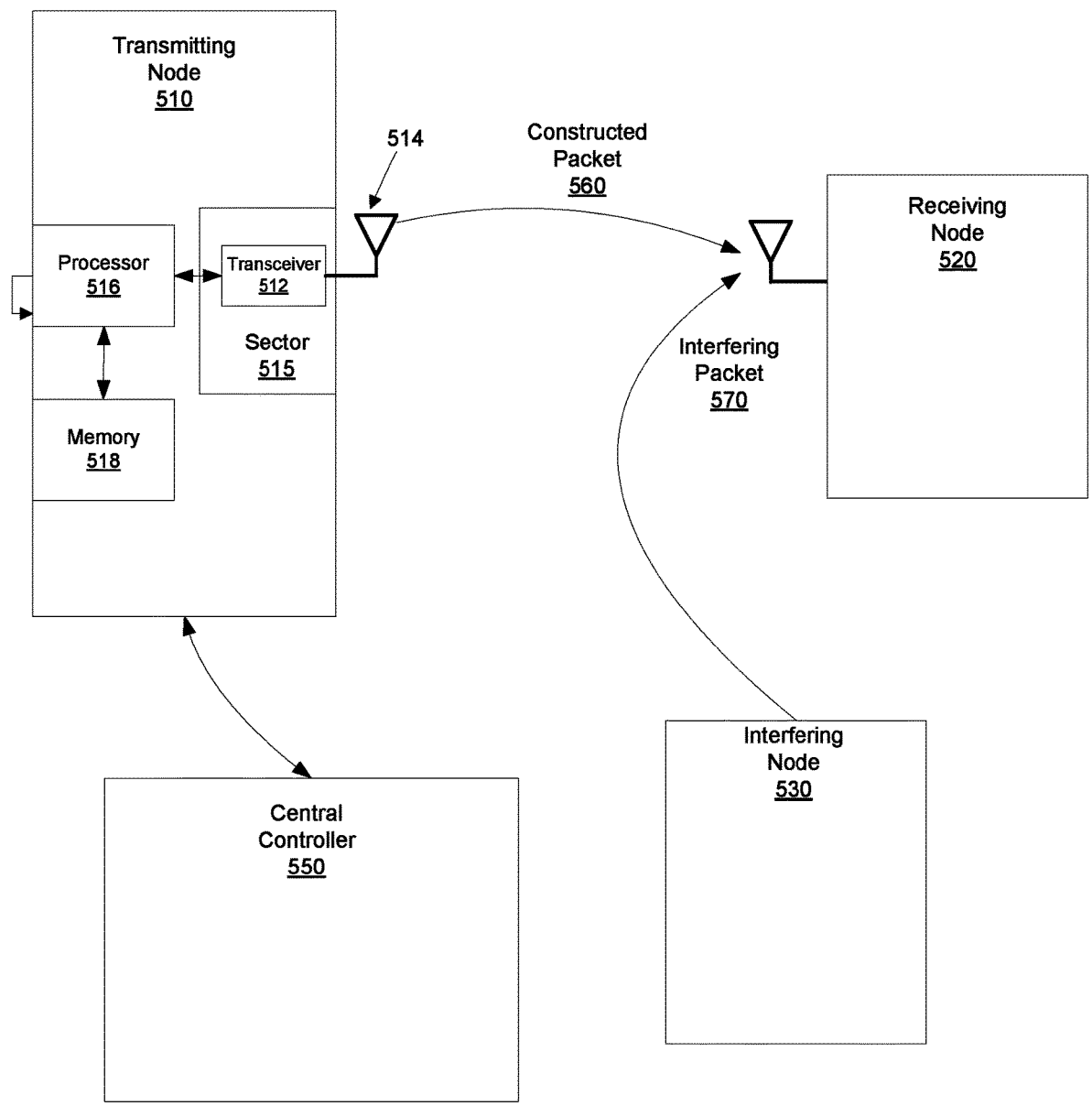
FIG. 5 shows a transmitting node and a receiving node, according to an embodiment.

FIG. 5 shows a transmitting node 510 and a receiving node 520, according to an embodiment. The transmitting node includes a transceiver 512, an antenna 514, a processor 516 and a memory 518. For an embodiment, a sector 515 includes the transceiver 512. For at least some embodiments, the transmitting node 510 and/or the receiving node 520 includes multiple sectors, wherein each sector includes a radio (transceiver)). For an embodiment, the memory 518 stores program instructions, wherein the program instructions are executable by the processor 516 to construct a packet including data that is to be transmitted to the receiving node 520 in the wireless network, wherein the constructed packet includes a short training field, a channel estimation field, a header field and a data payload. Further, the program instructions are executable by the processor 516 to control transmission by the transceiver 512 through the antenna 514 a jamming code before the short training field of the constructed packet, thereby reducing a likelihood that the receiving node will decode a different short training field of an interfering packet (such as, from interfering node 530) before the receiving node 520 decodes the short training field of the constructed packet.

For an embodiment, the constructed packet is to be transmitted to the receiving node 520 over a specific link between the transmitting node and the receiving node, and wherein constructing the packet for transmission over the specific wireless link includes the program instructions executing the processor to identify a reference sequence based on the specific wireless link, insert the reference sequence into at least a portion of a preamble of the packet, and control transmission of the constructed packet through the over the specific wireless link.

For at least some embodiments, the processor identifies the reference sequence by accessing the reference sequence from storage. That is, for an embodiment, references codes are predetermined for each specific link between the transmitting node 510 and other nodes. The reference codes are retrieved and used based upon the specific link the constructed packet is to be transmitted over.

For at least some embodiments, identifying the reference sequence based on the specific wireless link includes the program instruction executing the processor to retrieve the reference sequence. Before the reference sequence is retrieved, interference between the specific link and at least one other link of the wireless network is characterized, and wherein the reference sequence is assigned to the specific link, and another sequence is assigned to the at least one other link of the wireless network based on the characterizing of the interference. The assigned sequences can be stored for future retrieval.

For at least some embodiments, identifying the reference sequence based on the specific wireless link includes the program instruction executing the processor to retrieve the reference sequence. The reference sequence can be retrieved from the local memory 518, or from external storage. Before the reference sequence is retrieved, for at least some embodiments, a subset of codes from available codes is selected. Further, links of the wireless network are grouped into a plurality of groups based on connectivity of the links between transmitting nodes of nodes of the wireless network, interference between at least one link of a first group of the plurality of groups and at least one link of a second group of the plurality of groups is characterized, wherein at least one of the first group or the second group includes the specific wireless link. Further, at least one code of the subset of codes is assigned to the first group and at least one other code of the subset of codes to the second group based on the characterizing of the interference. Further, the transmitting node 510 is configured (configuration can include storing the reference sequence in the external storage, in the memory 518, or making the reference sequence available to the transmitting node by some other available means) with the references sequence, wherein the reference sequence includes one of the subset of codes of the first group or one of the subset of codes of the second group based on which of the first group or the second group includes the specific wireless link.

FIG. 6 is a flow chart that includes acts of a method for use in a wireless communication network, according to an embodiment. A first act 610 includes constructing, by a sector of a transmitting node, a packet including data that is to be transmitted to a receiving node in the wireless network, wherein the constructed packet includes a short training field, a channel estimation field, a header field, and a data payload. A second act 620 includes transmitting by the sector of the transmitting node, a jamming code before the short training field of the constructed packet, thereby reducing a likelihood that the receiving node will decode a different short training field of an interfering packet before the receiving node decodes the short training field of the constructed packet. An embodiment includes pre-appending the jamming code to the constructed packet. An embodiment includes post-appending the jamming code to a packet that is transmitted before the constructed packet is transmitted. For an embodiment, transmitting the jamming code before the short training field includes transmitting the jamming code immediately before the short training field. For an embodiment, the constructed packet includes the jamming signal code 262 that precedes the short training field of the constructed packet. As previously described, for an embodiment, the interfering packet 270 also includes a jamming signal code 272 that precedes its short training field. The jamming signal code 262 of the desired packet 260 has the purpose of preventing a receiving node from being able to lock on to and decode the short training field of a packet that arrives before the short training field of the desired packet.

As previously described, in some embodiments, the jamming signal field can comprise a random sequence or a Golay sequence (sequences with the useful property that their out-of-phase aperiodic autocorrelation coefficients sum to zero) that is selected to interfere with the detection of a short training field.

An embodiment includes coding the short training field of the constructed packet to uniquely address the receiving node. An embodiment includes coding the header field of the constructed packet to uniquely address the receiving node. For an embodiment, the coding includes identifying a reference sequence based on a specific wireless link between the sector of the transmitting and the receiving node.

For an embodiment, the constructed packet is to be transmitted to the receiving node over a specific link between the transmitting node and the receiving node. Further, constructing the packet for transmission over the specific wireless link includes identifying a reference sequence based on the specific wireless link, inserting the reference sequence into at least a portion of a preamble of the packet, and transmitting, by the sector, the configured packet over the specific wireless link. For an embodiment, the jamming code is the reference sequence.

For an embodiment, the sector of the transmitting node 510 performs the identifying of the reference sequence. For an embodiment, central controller 550 performs the identifying of the reference sequence, and the central controller provides the reference sequence to the sector.

For an embodiment, inserting the reference sequence into the at least the portion of the preamble includes pre-appending the reference sequence to the at least the portion of the preamble.

For an embodiment, the reference sequence includes a complementary sequence. For an embodiment, the complementary sequence includes a Golay sequence. An embodiment includes repeating the reference sequence inserted into the preamble. For an embodiment, a phase of at least a portion of the repeating reference sequence changes within the preamble.

For an embodiment, identifying the reference sequence based on the specific wireless link includes characterizing interference between the specific link and at least one other link of the wireless network, and assigning the reference sequence to the specific link, and another sequence to the at least one other link of the wireless network based on the characterizing of the interference.

For an embodiment, identifying the reference sequence based on the specific wireless link, includes selecting a subset of codes from available codes, grouping links of the wireless network into a plurality of groups based on connectivity of the links between sectors of nodes of the wireless network, characterizing interference between at least one link of a first group of the plurality of groups and at least one link of a second group of the plurality of groups, wherein at least one of the first group or the second group includes the specific wireless link, assigning at least one code of the subset of codes to the first group and at least one other code of the subset of codes to the second group based on the characterizing of the interference, and configuring the sector with the references sequence, wherein the reference sequence comprises one of the subset of codes of the first group or one of the subset of codes of the second group based on which of the first group or the second group includes the specific wireless link.

The embodiments described include methods, apparatuses, and systems for mitigating packet interference between sectors of a wireless network. At least some embodiments include receiving, by a sector, data to be transmitted over a specific wireless link of a wireless network. A packet for transmission over the specific wireless link is configured, wherein the packet includes a preamble, and the data. Further, the configured packet is transmitted, by the sector, over the specific wireless link. For at least some embodiments, configuring the packet includes identifying a reference sequence based on the specific wireless link, and inserting the reference sequence into at least a portion of the preamble.

Figure 7A:
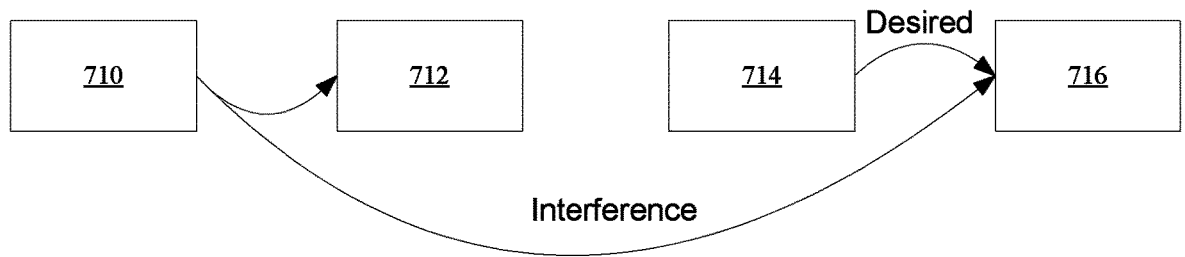
FIGS. 7A, 7B, 7C shows node configurations that can result in packet interference between links of a wireless network, according to some embodiments.
Figure 7B:
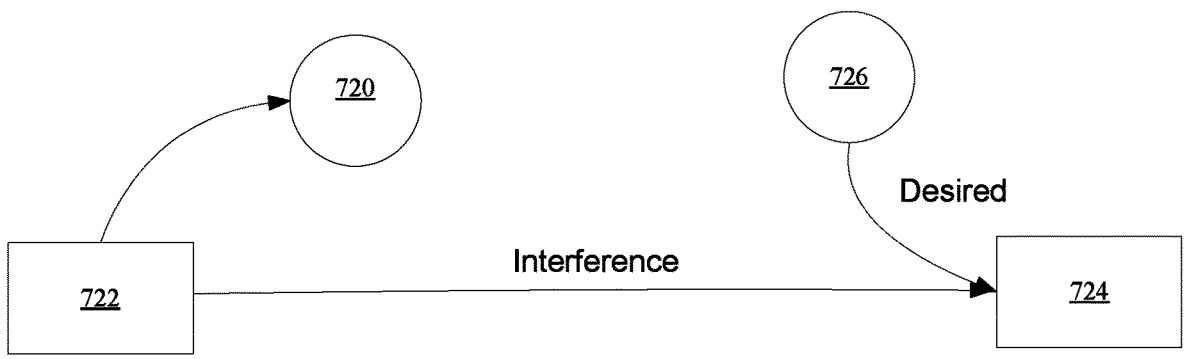
Figure 7C:
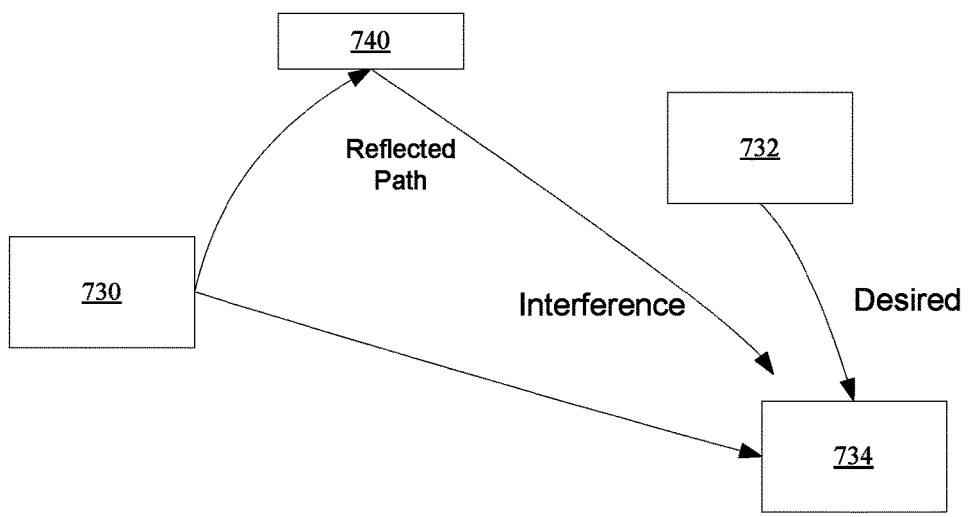

FIGS. 7A, 7B, 7C shows node configurations of a wireless network that can result in packet interference between links of the wireless network, according to some embodiments. FIG. 7A shows wireless nodes 710, 712, 714, 716 of the wireless network. Wireless node 710 may be wirelessly communicating with node 712. However, due to proximity or other factors, this wireless communication may cause interference with reception at node 716. That is, node 716 may be receiving wireless communication from node 714, but the wireless communication between node 710 and node 712 may interfere with the reception of the wireless communication by node 716.

FIG. 7B shows node 722 wirelessly communicating with client node 720. Further, client node 726 is communicating with node 724. However, the wireless communication between node 722 and client node 720 may interfere with the communication between client node 726 and node 724.

FIG. 7C shows a node 730 wirelessly communicating with a first sector of node 734, and node 732 wirelessly communicating with a second sector of node 734. For at least some embodiments, a node includes multiple sectors, wherein each sector includes at least a transceiver. However, the communication signal emanating from node 730 may reflect off of a reflector 740 and be redirected to interfere with the wireless communication between the node 732 and the second sector of node 734.

As shown, due to the large number of proximate wireless links, multipoint, multi-hop wireless networks are susceptible to interference between links of the wireless network. That is, wireless communication of one link between nodes of the wireless network can interfere with the wireless communication of one or more other link between other nodes of the wireless network.

Figure 8:
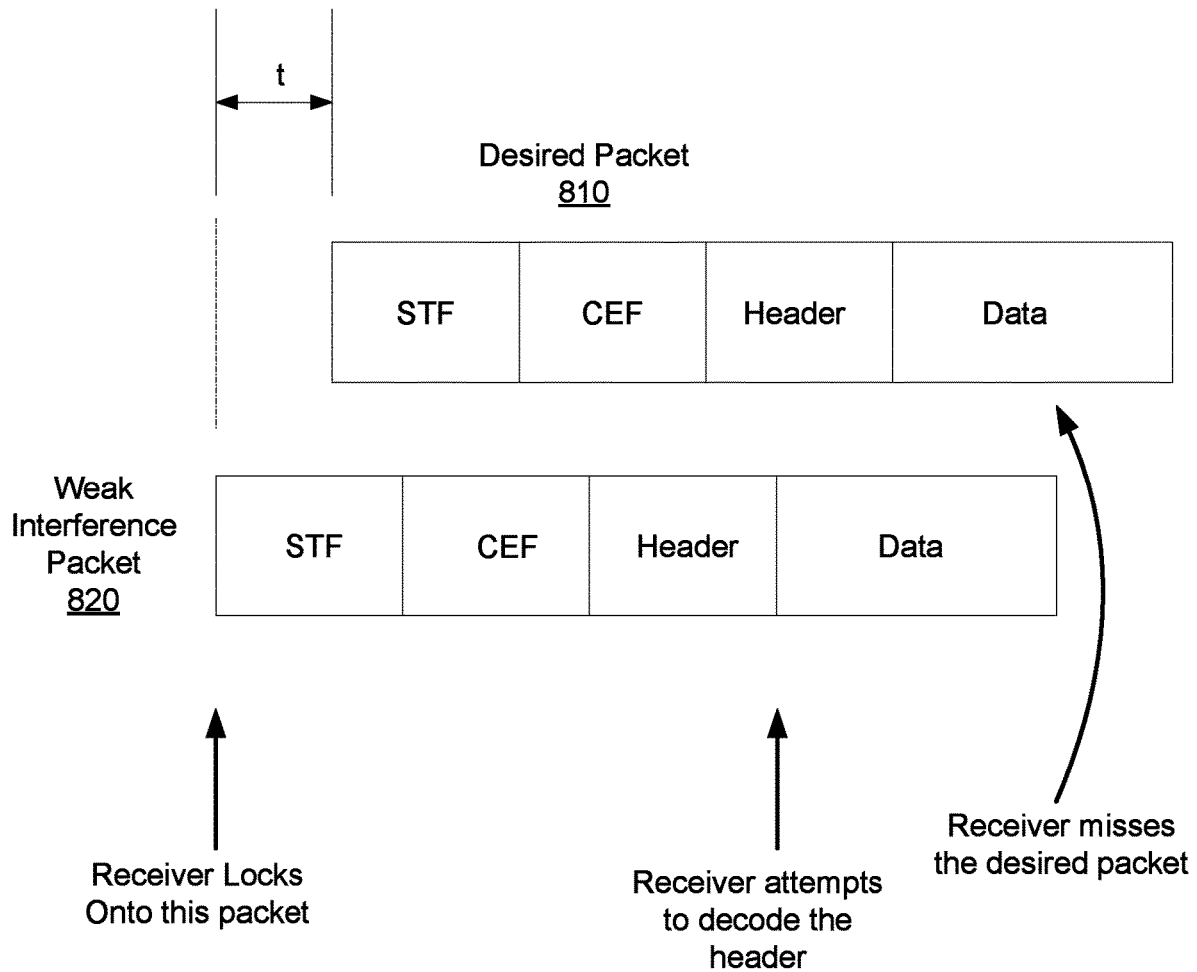
FIG. 8 shows a desired packet and an interfering packet, according to an embodiment.

FIG. 8 shows a desired packet 810 and an interfering packet 820, according to an embodiment. As shown, a receiver of a node of the wireless network can receive an interfering packet 820 before receiving a desired packet 810. The desired packet is an intended or desired packet of wireless communication over a link between the node and a transmitting node. However, due to the existence of other nodes of the wireless network, the node may also receive the interfering packet 820 a time t before receiving the desired packet 810.

The interfering packet 820 is generated by another node of the wireless network. Therefore, the interfering packet may be commonly constructed. For example, for an embodiment, one or more packets of the wireless network include a preamble that includes a short training field (STF) and a channel estimation (CE) field. Further, for an embodiment, the one or more packets further include a header and data.

Upon receiving the interfering packet 820 (also referred to as early weak interference) the receiver of the node may attempt to lock onto the early weak interference packet 820. That is, the early weak interference packet 820 may be similarly constructed as the desired packet 810, but the early weak interference packet 820 is received by the node a time t before receiving the desired packet 810. Therefore, the receiver of the node may misinterpret the early weak interference packet 820 as the desired packet 810, and attempt to lock onto the packet in order to receive and decode the packet. That is, for at least some embodiments, a receiving sector of a node uses the STF to detect the presence of a packet, and thereafter starts the remainder of the packet acquisition process. If the node inadvertently uses the STF of the weak interference signal to detect the presence of the packet, the node may start the remainder of the acquisition process. However, the early weak interference packet 820 is not the desired packet, and while the receiver of the node is attempting to lock onto and decode the early weak interference packet 820, the desired packet may be missed. Clearly this is undesirable.

Figure 9:
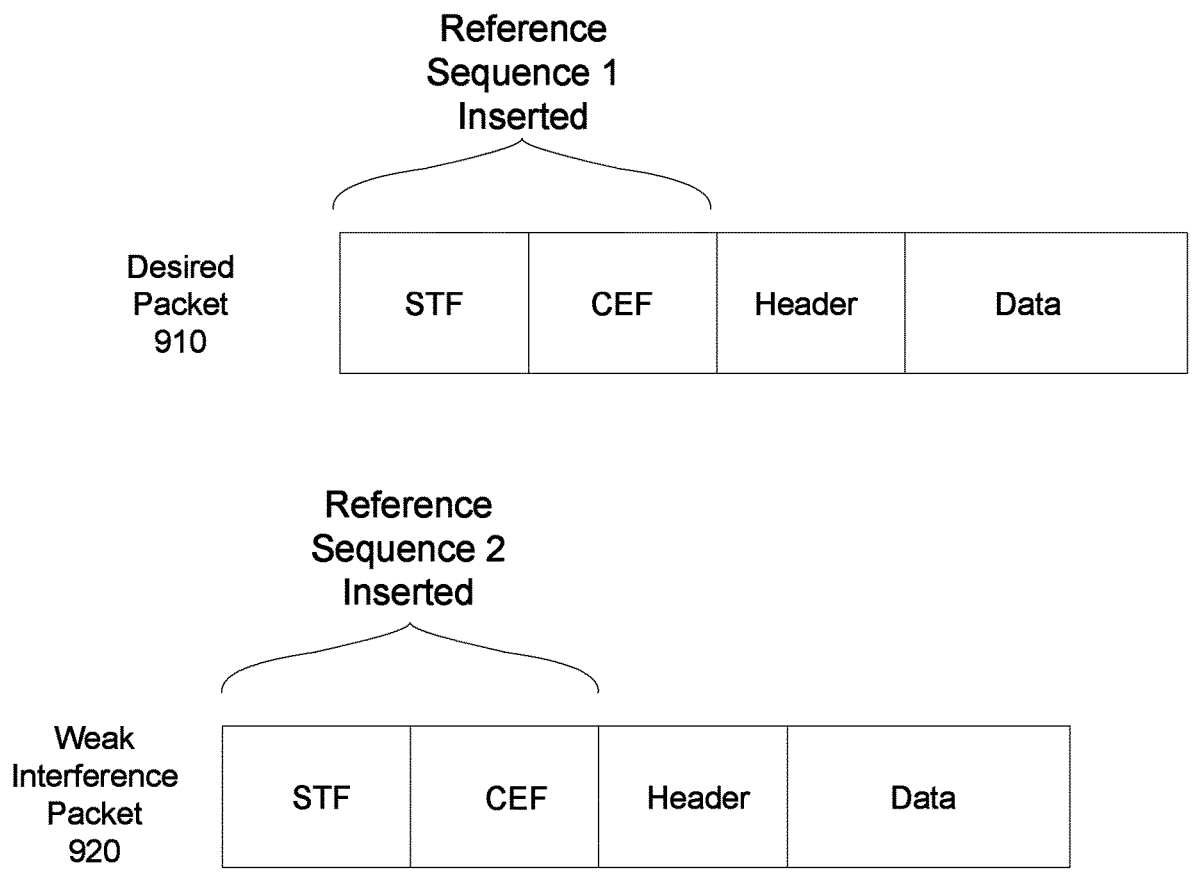
FIG. 9 shows a desired packet and an interfering packet, wherein each packet includes a different reference sequence, according to an embodiment.

FIG. 9 shows a desired packet 910 and an interfering packet 920, wherein each packet includes a different reference sequence, according to an embodiment. For at least some embodiments, a transmitting sector of a transmitting node inserts a reference sequence into at least a portion of the preamble of a packet to be transmitted. For at least some embodiments, the reference sequence is a specific reference sequence that is associated with a specific link. That is, for example, the specific link between the transmitting node and the node receiving the desired packet 910 has an associated reference sequence that the transmitting node inserts into at least a portion of the preamble of the desired packet 910. The node receiving the desired packet is able to identify the specific reference sequence for the specific link between the transmitter and the node, and the node uses this specific reference sequence to correlate the at least a portion of the preamble with the reference sequence that is selected based on the specific wireless link. The receiving nodes may start the remainder of the acquisition process.

For an embodiment, the transmitter of the weak signal interference packet 920 also inserts a different reference sequence into the preamble of the interfering packet 920. The reference sequences of the packets of interfering links are selected to be uncorrelated with the reference sequence of the desired packet of the specific link. Therefore, the node will not "lock on to" (that is, begin and continue processing) the undesired interfering packet 920 because the reference sequence of the interfering packet 920 is uncorrelated with the specific reference sequence associated with the specific link. Further, the receiving node will not begin the packet acquisition process when receiving the interfering packet 920, but rather, start the packet acquisition process upon receiving the desired packet 910.

Figure 10:
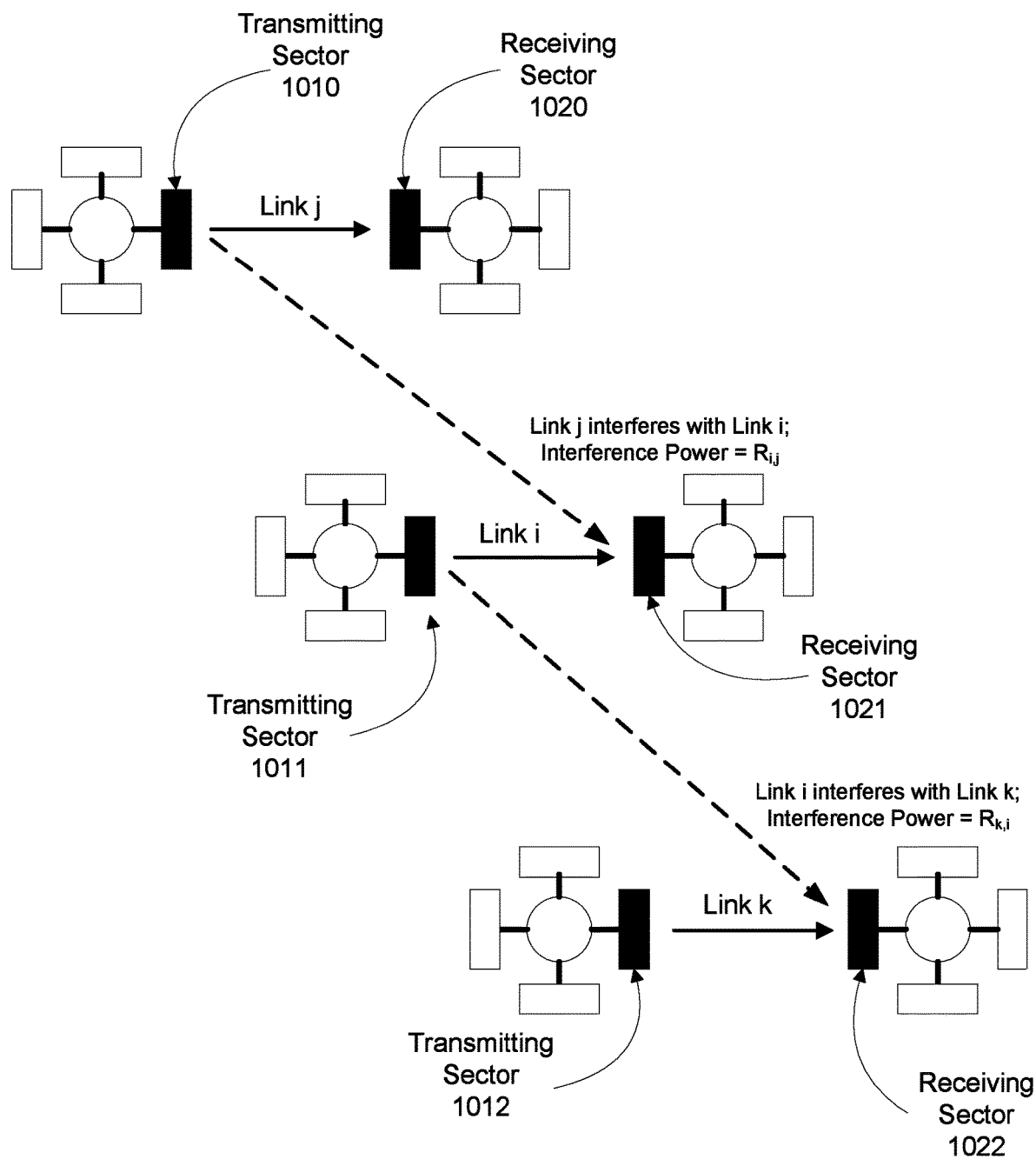
FIG. 10 shows multiple links between transmitting and receiving nodes, and further shows interference between different links, according to an embodiment.

FIG. 10 shows multiple links between transmitting and receiving nodes, and further shows interference between different links, according to an embodiment. At least some embodiments include identifying links of the wireless network that interfere with other wireless links of the wireless network. At least some embodiments include identifying groups of links of the wireless network that interfere with other groups of wireless links of the wireless network.

As shown, a link j is formed between a transmitting sector 1010 and a receiving sector 1020. Further, a link i is formed between a transmitting sector 1011 and a receiving sector 1021. Further, a link k is formed between a transmitting sector 1012 and a receiving sector 1022.

Due to the proximity and relative physical locations of each of the sectors and the links formed between the sectors, at least some of the links will cause interference within other links. The interference can be further influences by reflectors that vary the direction of travel of the wireless communication of the links, and by variations in the directivity of beams formed by multiple antennas of at least some embodiments of the sectors.

For example, the link j may cause at least some interference with the link i which can be represented by an indicator of the interference power $R_{ji}$. Further, the link i may cause at least some interference with the link k which can be represented by an indicator of the interference power $R_{ik}$.

For at least some embodiment, the interfering packets of these interfering link have reference sequences inserted into at least a portion of the preambles of the interfering packets to prevent receivers of victim links (wireless links that suffer from interference due to the interfering links) from attempting to lock onto the interfering packets of the interfering links.

Grouping of Links

Figure 11:
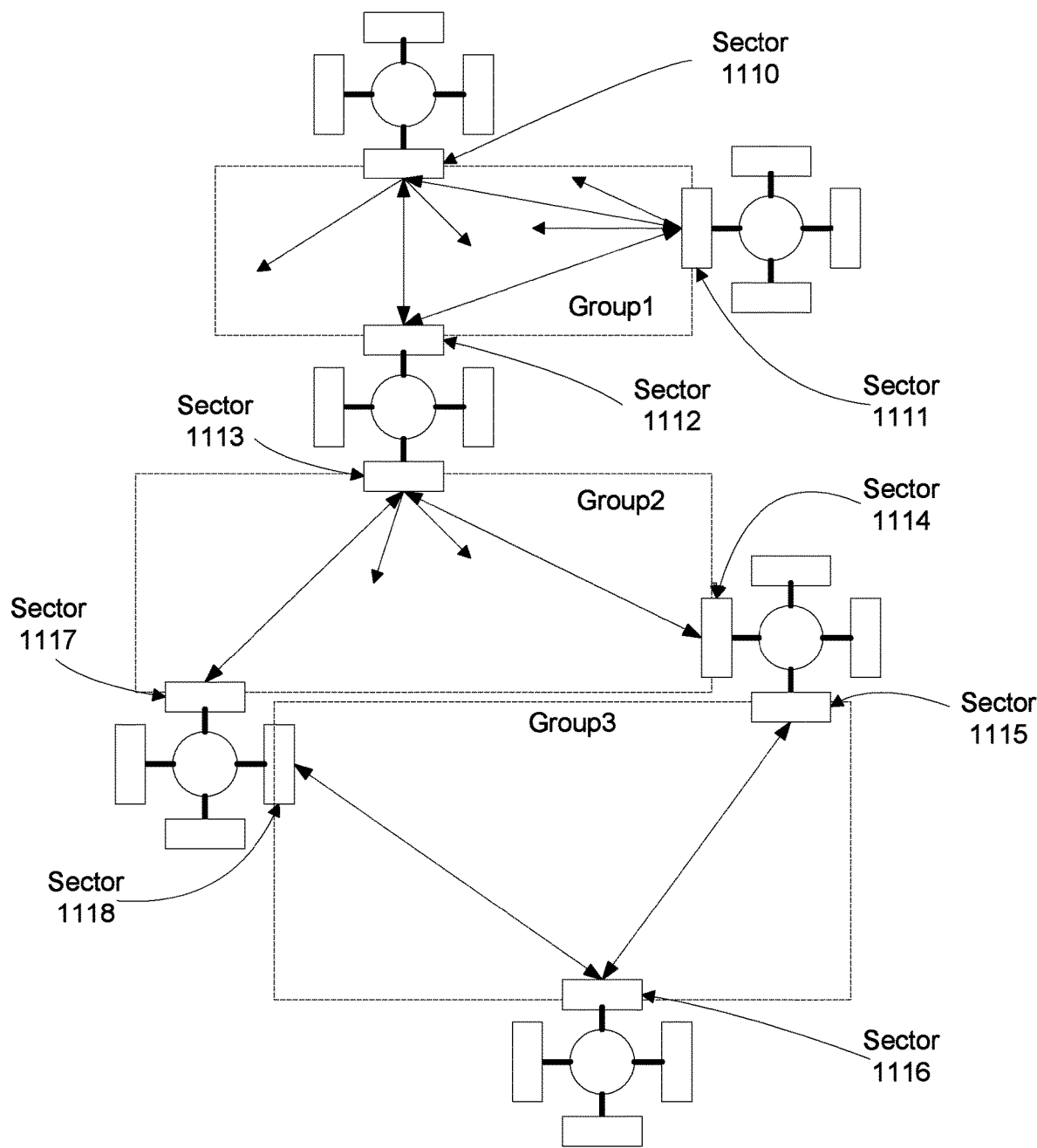
FIG. 11 shows groupings of links, according to an embodiment.

FIG. 11 shows groupings of links, according to an embodiment. As previously described, the effects of packet interference can be mitigated by inserting a different reference sequence into the preamble of the packet communicated through each different link. That is, for an embodiment, each group includes a single link. However, the number of possible reference sequences can be limited, and processing overhead is increased as the number of different reference sequences is increased. Accordingly, for an embodiment, the links are grouped. Once the links are grouped, a group that is determined to include one or more links that interfere with one or more links of another group is assigned a code (reference sequence) that is different, and uncorrelated with the reference sequence of the other group. Sectors associated with the one of more links of a group are assigned the reference sequence selected for the group. The sectors then use the assigned code for packets communication over the specific one or more links of the associated group. For an embodiment, a single code (reference sequence) is used for both transmission and reception of packets by a sector. For an embodiment, a first code (reference sequence) is used for transmission of packets by a sector, and a second code (reference sequence) is used for reception of packets by the sector.

For an embodiment, grouping links of a wireless network into a plurality of groups is based on a connectivity of the links between sectors of the wireless network.

FIG. 5 shows groupings of links, according to an embodiment. A first group (Group1) includes links formed between sectors 1110, 1111, 1112. The sectors are each a part of different nodes of the wireless network and include two-way (transmit and receive) communication.

For an embodiment, the links are grouped by the wireless connectivity between communicating sectors. For example, sectors 1110, 1111, 1112 are directly connected (that is, there is a single wireless hop between any two of these sectors), and form a first group (Group1).

A second group (Group2) includes sectors 1113, 1114, 1117 due to the direct connectivity of these sectors. A third group (Group3) includes sectors 1115, 1116, 1118 due to the direct connectivity of these sectors.

As will be described, if one or more of the links of one group interfere with one or more links of another group, the two groups are assigned different codes (reference sequences) to mitigate interferences between links of the two groups.

Figure 12:
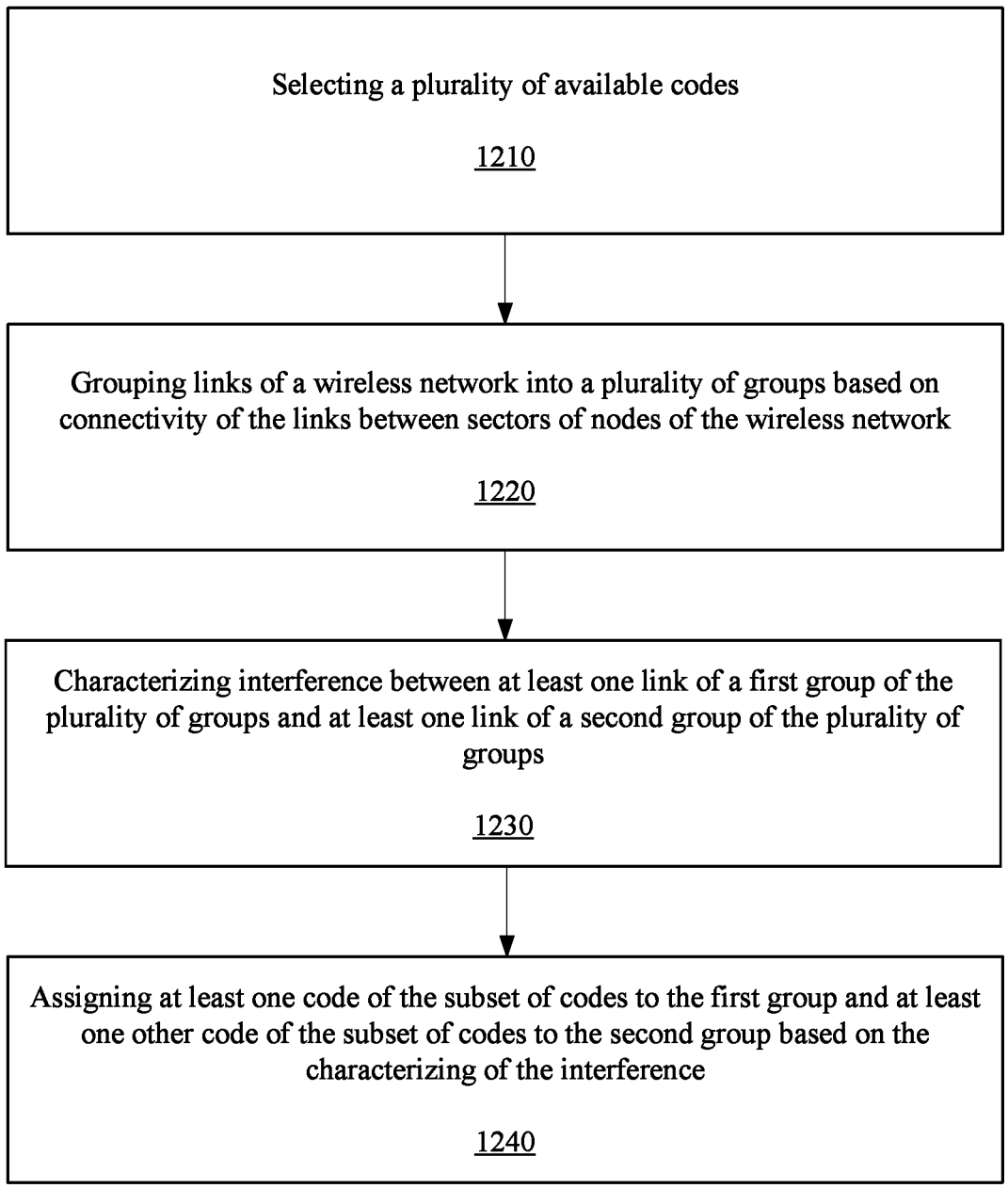
FIG. 12 is a flow chart that includes steps of a method of selecting codes for groups of links, according to an embodiment.

FIG. 12 is a flow chart that includes steps of a method of selecting codes for groups of links, according to an embodiment. A first step 1210 includes selecting a plurality of available codes, which can include selecting a subset of codes from available codes. That is, a set number of say 128 codes may be available. However, for an embodiment, the number of codes may be limited to ensure a level of correlation between each of the codes that is below a desired threshold. The less correlated the codes, the less likely that a sector assigned one code will be inadvertently received and attempt to decode a packet having another code. For an embodiment, the codes include a complex valued constituent base sequence. For an embodiment, the codes include complementary sequences or codes. For an embodiment, the codes include Golay codes. For an embodiment, the codes include a pseudo random sequences or codes. For an embodiment, the codes include a random complex sequence.

A second step 1220 includes grouping links of a wireless network into a plurality of groups based on connectivity of the links between sectors of the wireless network. The connectivity of links can be used to select the different groups of links. A link includes a transmitting sector and a receiving sector. For an embodiment, a link includes a pair-wise connection between two sectors.

A third step 1230 includes characterizing interference between at least one link of a first group of the plurality of groups and at least one link of a second group of the plurality of groups. For an embodiment, the characterizing interference between at least one link of a first group of the plurality of groups and at least one link of a second group of the plurality of groups includes measuring the interference. For example, one sector associated with at least one of the links of one group can measure a level of interference received from another sector associated with at least one of the links of one other group. Each sector includes a transceiver which receives wireless signals. The level of interference of the received wireless signals can be measured. For an embodiment, the measured level of interference is compared to one or more thresholds that provide an indication of interference between the one group and the other group. That is, an indicator indicates interference between the groups if the measured interferences have a value that is above a threshold.

For an embodiment, the characterizing interference between at least one link of a first group of the plurality of groups and at least one link of a second group of the plurality of groups includes predicting interference between links or groups of links based on modeling or simulation of the wireless network. For an embodiment, the characterizing utilizes a topology of the wireless network. For an embodiment, the characterizing uses physical distance between links or nodes for characterizing or estimating interference between the links or groups of links. At least some embodiments utilize previously determined information of interference between links. Further, the characterizing may utilize information of other parameters that influence propagation of interference signals, such as other data such, humidity etc.

For an embodiment, the characterizing interference between at least one link of a first group of the plurality of groups and at least one link of a second group of the plurality of groups includes a random assignment of a code to a group of links. That is, the coding assigned to each group can be randomly assigned, whether or not any measurements or predictions are made. Even assuming a random relationship of the interference between the groups and assigning codes provides benefits over not assigning the coding to groups of links.

A fourth step 1240 includes assigning at least one code of the subset of codes to the first group and at least one other code of the subset of codes to the second group based on the characterizing of the interference. For an embodiment, a first code is assigned to the first group and a second code is assigned to the second group. For an embodiment, the first code and the second code are identified or selected by an indicator of a level of correlation between the codes.

For at least some embodiments, a first sector associated with a first specific link that is within the first group configures packets for transmission using the first code, and a second sector associated with a second specific link that is within the second group configures packets for transmission using the second code. For an embodiment, configuring the packets for transmission includes identifying an assigned code (reference sequence) based on that group that the specific wireless link is within, and inserting the assigned code (reference sequence) into at least a portion of the preamble. The sector then transmits the configured packet over the specific wireless link. That is, the first sector inserts the first code into at least a portion of the preamble of packets for transmission over the first specific link, and the second sector inserts the second code into at least a portion of the preamble of packets for transmission over the second specific link.

For an embodiment, the assignment of codes to groups of links is performed while the wireless network is being designed or deployed. That is, the code selections, the grouping of the links of the wireless network, characterizing the interferences between groups, and the code assignments are performed before deployment. These processes may be performed, for example, by a network floor planning process.

For an embodiment, the assignment of codes to groups of links is performed when the wireless network is modified. That is, at least one of the code selections, the grouping of the links of the wireless network, characterizing the interferences between groups, or the code assignments are performed as new sectors are added to the wireless network.

For an embodiment, the assignment of codes to groups of links is performed periodically while the wireless network is in steady state operation. That is, at least one of the code selections, the grouping of the links of the wireless network, characterizing the interferences between groups, or the code assignments are performed periodically while the wireless network is in steady state operation.

For an embodiment, the assignment of codes to groups of links is adaptively performed while the wireless network is in steady state operation. That is, at least one of the code selections, the grouping of the links of the wireless network, characterizing the interferences between groups, or the code assignments are adaptively performed while the wireless network is in steady state operation. For example, if performance of the wireless network is sensed to be decreasing, the network can adaptively repeat at least some of the steps of the assignment of codes to groups of links.

For an embodiment, the assignment of codes to groups of links is performed manually. That is, at least one of the code selections, the grouping of the links of the wireless network, characterizing the interferences between groups, or the code assignments are triggered based on actions of a network operator.

The characterizing of the interference between the links of the first group and the links of the second group provides for identification of at least some interference between the links of the first group and links of the second group. Accordingly, codes are assigned to the first group and the second group in order to mitigate interference (for example, the early weak signal interference) of packets communicated over one or more of links of the first group with packets communicated over one or more of the links of the second group.

For at least some embodiments, the sectors include multiple antenna elements. Therefore, the sectors can form beam during transmission and reception of wireless communication signals. Due to the focusing and concentration of beams, transmission and reception is improved, and self-interference within the wireless network is reduced as the energy of the wireless communication signals is focused in the beam forming direction.

At least some embodiments include assigning different codes to each group of pairs of groups of the plurality of groups based on interference between at least one link of one group of a pair of groups and at least one link of another group of the pair of groups. For an embodiment, different codes assigned to each group when interference between groups is greater than a threshold.

For an embodiment, each group comprises a single link. That is, each link of the wireless network is identified as a separate group and each link is assigned a different code. In some wireless networks that include many links, this may be onerous and processing intensive.

For an embodiment, a link is defined in part by a direction of the connection between a transmitting sector and a receiving sector. That is, for an embodiment, one or more links of the wireless network are unidirectional. That is, each direction of wireless communication between sectors of the wireless network may comprise an individual link. Accordingly, for an embodiment, wireless communication between two sectors in a first direction is a first link, and wireless communication between the two sectors in a second direction is a second link. Further, the first link and the second link can be included within separate groups.

For an embodiment, each group includes one or more links. The number of code assignments can be reduced by grouping multiple links. Since a code is assigned to each group, multiple links are assigned same code.

At least some embodiments include configuring one or more sectors associated with the one or more links of each of the plurality of groups with the assigned at least one of the subset of codes. As previously described, each link forms a wireless connection between two sectors of the wireless network. Further, links of a group are assigned a code. The sectors of each link code and decode packets communicated through the link with the code (reference sequence) assigned to the link between the sectors. For an embodiment, the sectors are configured with the assigned codes. For an embodiment, configuring the sectors includes providing the each sector with a configuration parameter list, wherein the configuration parameter list includes the at least one of the subset of codes assigned to the grouped links of the node.

For an embodiment, each sector is assigned a single code for both reception and transmission. This can simplify processing because the sector does not need to update the code the sector is using to code packet or decode packets.

For an embodiment, each sector is assigned at least one code for reception and at least one code for transmission. For at least some embodiments, a node of the wireless network includes multiple sectors. If the sectors are communicating over a common channel, assigning one code for reception and one code for transmission helps to minimize interference between sectors. Further, as previously described, at least some links are defined as unidirectional. Therefore, for at least some embodiments, different codes can be assigned to links that include communication in different directions. Accordingly, a sector may be associated with one group when transmitting packets and with another group when receiving packets.

Due to the grouping and code assignments, within a particular group, one sector may have an assigned code for transmission while another sector (e.g., a "reciprocal sector") will have the same assigned code for reception. These assigned codes can stay the same, or change (if the link directions are grouped differently) when the roles are reversed and one sector is receiving and the reciprocal sector is transmitting.

Code Selection

For a given system, there are multiple codes available for selection. For an embodiment, selecting the subset of the available codes includes selecting few enough codes to provide correlation between each of the codes of the subset of codes of less than a threshold. That is, if too many codes are selected for assignment, the correlation between any two of the selected codes may not be great enough to allow a receiving node to properly distinguish between a desired packet and an interfering packet.

Further, at least some embodiments include at least a minimum number of codes. For at least some embodiments, a code is assigned to each of the identified groups. In order to minimize interference between the groups, a minimum number of possible codes for assignment may be desired.

At least some embodiments include selecting specific codes of the subset of codes based on a capability or a characteristic of a receiver of at least one sector of the nodes. That is, the sectors can include different types of receivers that include different capabilities or characteristics. For an embodiment, the receiver type is identified during ignition (for example, during deployment of the wireless network). For an embodiment, the receiver type is identified and characterized during design or initial simulation and testing. For at least some embodiments, different receiver types react differently to different types of reference sequences. For an embodiment, different receiver types include different packet acquisition algorithms.

For at least some embodiments, the receiver characteristics which are predicted, observed, or measured, are provided with the reference sequence which is selected based at least in part on the receiver characteristics. For an exemplary embodiment, the reference sequences are selected by feeding Golay sets into a standard (IEEE 802.11ad) Golay generator. The Golays sets in of Table 1 contain the sequence indices of the respective Golay sequences. The sequence is generated by using the binary representation of the index as input (W matrix) to the standard 11ad Golay generator. Note that index 5 represents the default Golay used in the 11ad standard.

TABLE 1

Golay Set

Size = 2 {5, 69}
Size = 3 {5, 59, 128}
Size = 4 {5, 59, 128, 66}
Size = 5 {5, 59, 128, 66, 1}

As previously described, for at least some embodiments, grouping links of the wireless network is based on connectivity of the links between sectors of nodes of the wireless network is based upon a topology of the wireless network. For at least some embodiments, grouping links of the wireless network based on connectivity of the links between sectors of nodes of the wireless network includes identifying one or more links between sectors of the wireless network, and grouping the one or more links.

Characterizing Interference

For at least some embodiments, characterizing the interference includes generating an interference matrix wherein each entry of the interference matrix includes at least one indicator of interference of an ith group on a jth group. More specifically, for an embodiment, characterizing the interference includes generating an interference matrix wherein each entry of the interference matrix includes the at least one indicator of interference of an ith group on a jth group of the wireless network. Once created, the interference matrix provides a convenient vehicle for identifying interferences between groups of links of the wireless network.

Alternatively, for at least some embodiments, characterizing the interference includes generating an interference matrix wherein each entry of the interference matrix includes at least one indicator of interference of an ith link on a jth link. More specifically, for an embodiment, characterizing the interference includes generating an interference matrix wherein each entry of the interference matrix includes the at least one indicator of interference of an ith link on a jth link of the wireless network. Once created, this interference matrix provides a convenient vehicle for identifying interference between links of the wireless network.

As previously described, for at least some embodiments, characterizing interference between at least one link of a first group of the plurality of groups and at least one link of a second group of the plurality of groups includes predicting interference of one or more links of the first group with one or more links of a second group based on simulation and/or testing of network pre-planning.

For at least some embodiments, characterizing interference between at least one link of a first group of the plurality of groups and at least one link of a second group of the plurality of groups includes sensing interference of one or more links of the first group with one or more links of a second group. For an embodiment, interference between links of groups is indicated if the sensed interference is greater than a threshold. For an embodiment, the interference between groups is sensed over time, allowing for adaptive updates to the code assignments. That is, over time different groups of links may cause interferences to be sensed by other different groups. Accordingly, the code assignment for the links can be updated as interference between the groups is sensed.

For at least some embodiments, characterizing interference between at least one link of a first group of the plurality of groups and at least one link of a second group of the plurality of groups includes characterizing interference of a first number of links of the first group with a second number of links of a second group. That is, interferences is indicated if the first number links of the first group are determined to be interfering with the second number of links of the second group.

Code Assignment

As previously stated, for an embodiment, different groups are assigned different codes. Further, for an embodiment, groups that interfere with each other are assigned codes based on level of correlation between the available codes. That is, it is desirable to assign codes that are the least (or below threshold) correlated to the groups that interfere with each other.

For an embodiment, due to the finite number of available codes, different groups are assigned the same codes. That is, if there are large enough number of groups, all of the available codes can be used up during assignment to the groups, and at least some codes will have to be reused with multiple groups. Ideally, groups assigned the same code do not have any interference with each other. However, if there is some interference between groups an all available codes have been used, the codes are reused based on the correlation between the available codes and the level of interference between the groups being assigned.

As will be described later, at least some embodiments further include receiving, by a sector of the wireless network, data to be transmitted over a specific wireless link of the wireless network, wherein the specific wireless link belongs to one of the first group or the second group. A packet for transmission over the specific wireless link is configured, wherein the packet includes a preamble and the data. For an embodiment, configuring the packet includes obtaining a reference sequence based on the assigned at least one of the subset of codes of the first group or second group of the specific wireless link, and inserting the reference sequence into at least a portion of the preamble. Finally, the configured packet is transmitted over the wireless link.

Figure 13:
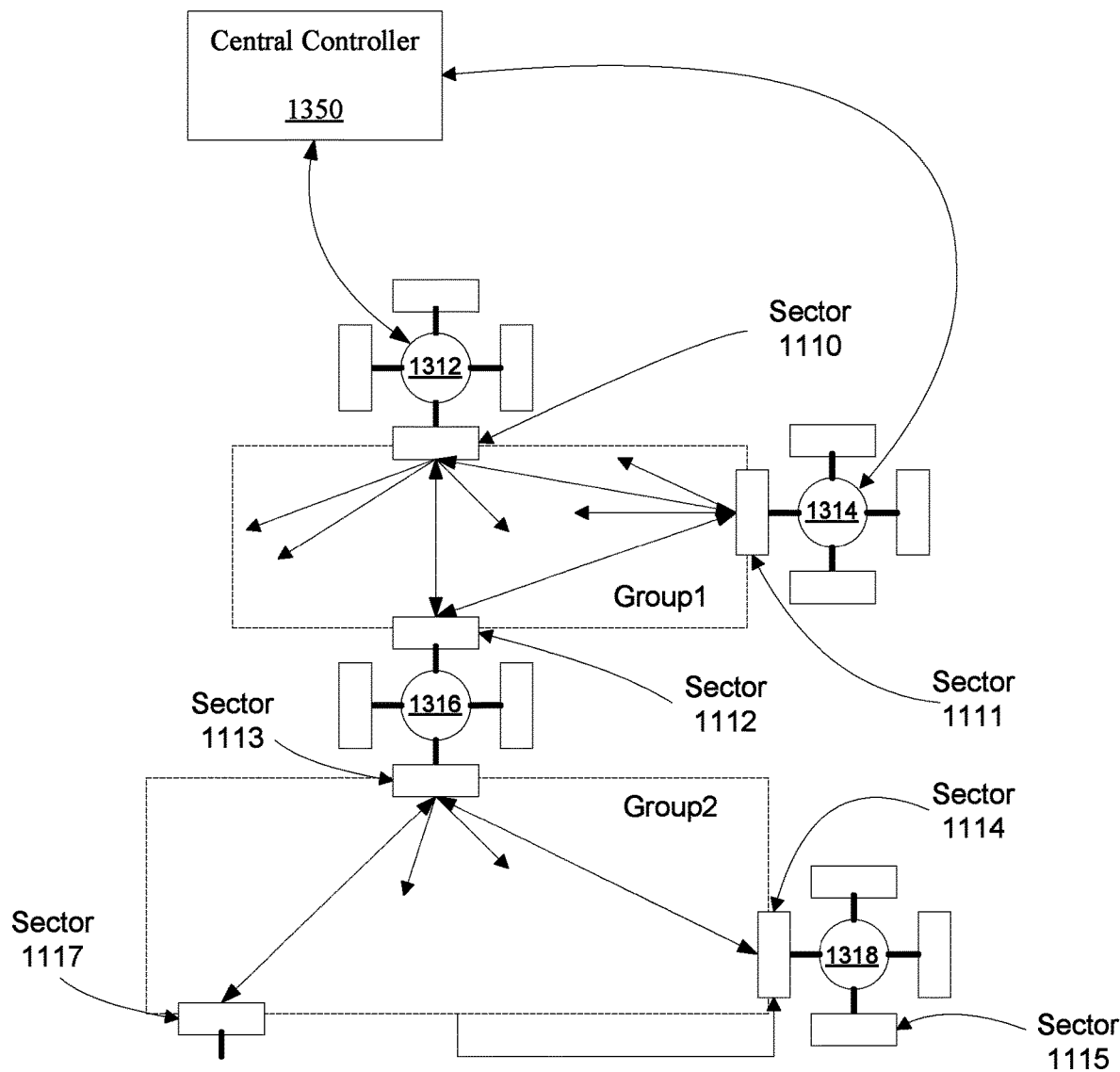
FIG. 13 is a block diagram of a wireless network, according to an embodiment.

FIG. 13 is a block diagram of a wireless network, according to an embodiment. As shown the wireless network includes multiple nodes 1312, 1314, 1316, 1318 and a central controller 1350. Further, one or more of the nodes 1312, 1314, 1316, 1318 include multiple sectors, such as sectors 1110, 1111, 1112, 1113, 1114, 1115, 1117. As shown, the central control 1350 is connected to at least one of the nodes 1312, 1314.

For at least some embodiments, one or more of the steps of selecting a subset of codes from available codes, grouping links of a wireless network into a plurality of groups based on connectivity of the links between sectors of the wireless network, characterizing interference between at least one link of a first group of the plurality of groups and at least one link of a second group of the plurality of groups, or assigning at least one code of the subset of codes to the first group and at least one other code of the subset of codes to the second group based on the characterizing of the interference, occurs at the central server. For at least some embodiments, one or more of the steps of selecting a subset of codes from available codes, grouping links of a wireless network into a plurality of groups based on connectivity of the links between sectors of the wireless network, characterizing interference between at least one link of a first group of the plurality of groups and at least one link of a second group of the plurality of groups, or assigning at least one code of the subset of codes to the first group and at least one other code of the subset of codes to the second group based on the characterizing of the interference, occurs at one or more of the nodes or sectors of the wireless network. For at least some embodiments, at least some of the steps occur upstream from the central controller, such as, in the cloud.

Figure 14:
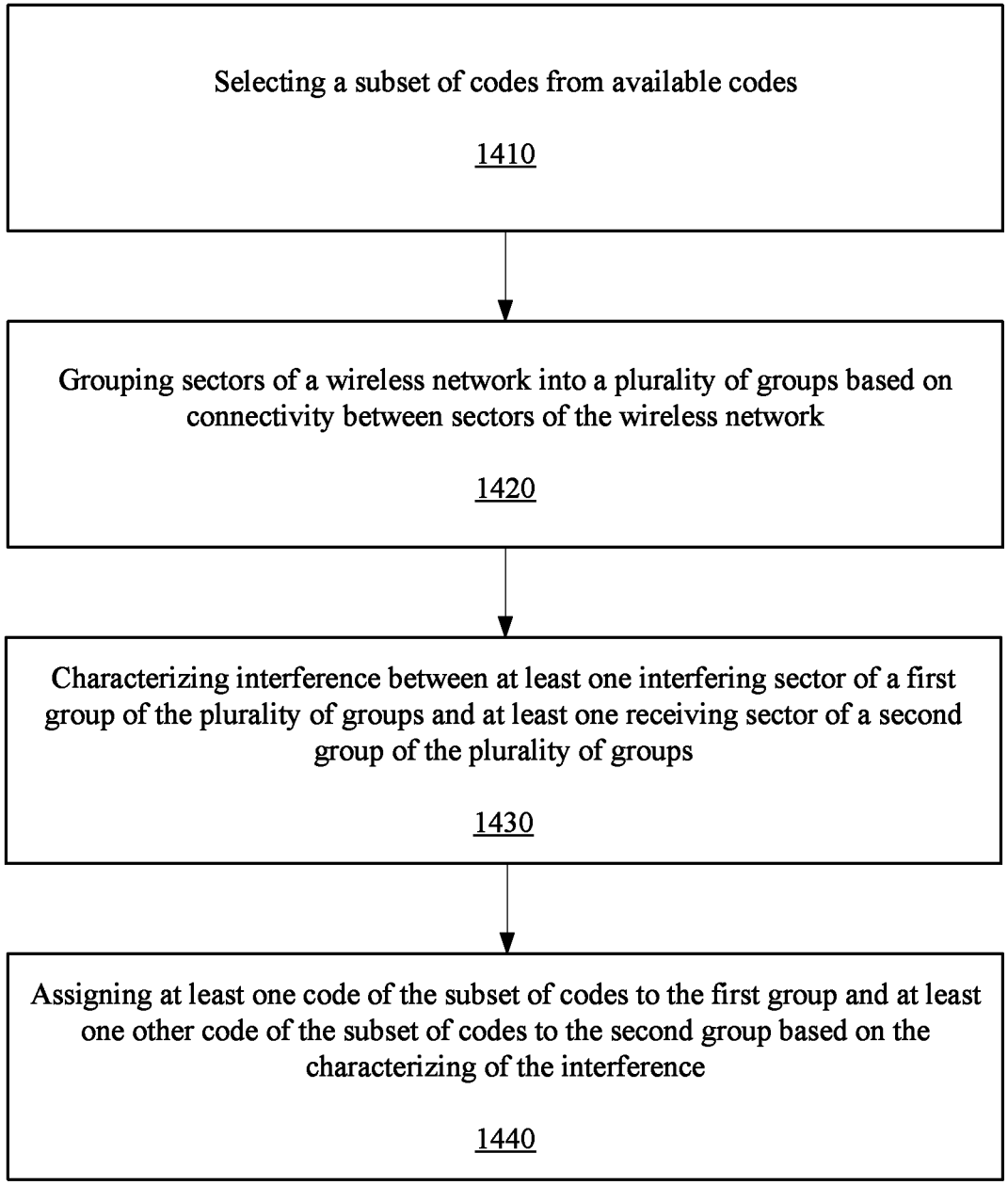
FIG. 14 is a flow chart that includes steps of a method of selecting codes for sectors of a wireless network, according to an embodiment.

FIG. 14 is a flow chart that includes steps of a method of selecting codes for sectors of a wireless network, according to an embodiment. That is, while the grouping was previously described as grouping of links, at least some embodiments include grouping of sectors. For this embodiment, a first step 1410 includes selecting a subset of codes from available codes. A second step 1420 includes grouping sectors of a wireless network into a plurality of groups based on connectivity between sectors of the wireless network. A third step 1430 includes characterizing interference between at least one interfering sector of a first group of the plurality of groups and at least one receiving sector of a second group of the plurality of groups. A fourth step 1440 includes assigning at least one code of the subset of codes to the first group and at least one other code of the subset of codes to the second group based on the characterizing of the interference.

Figure 15:
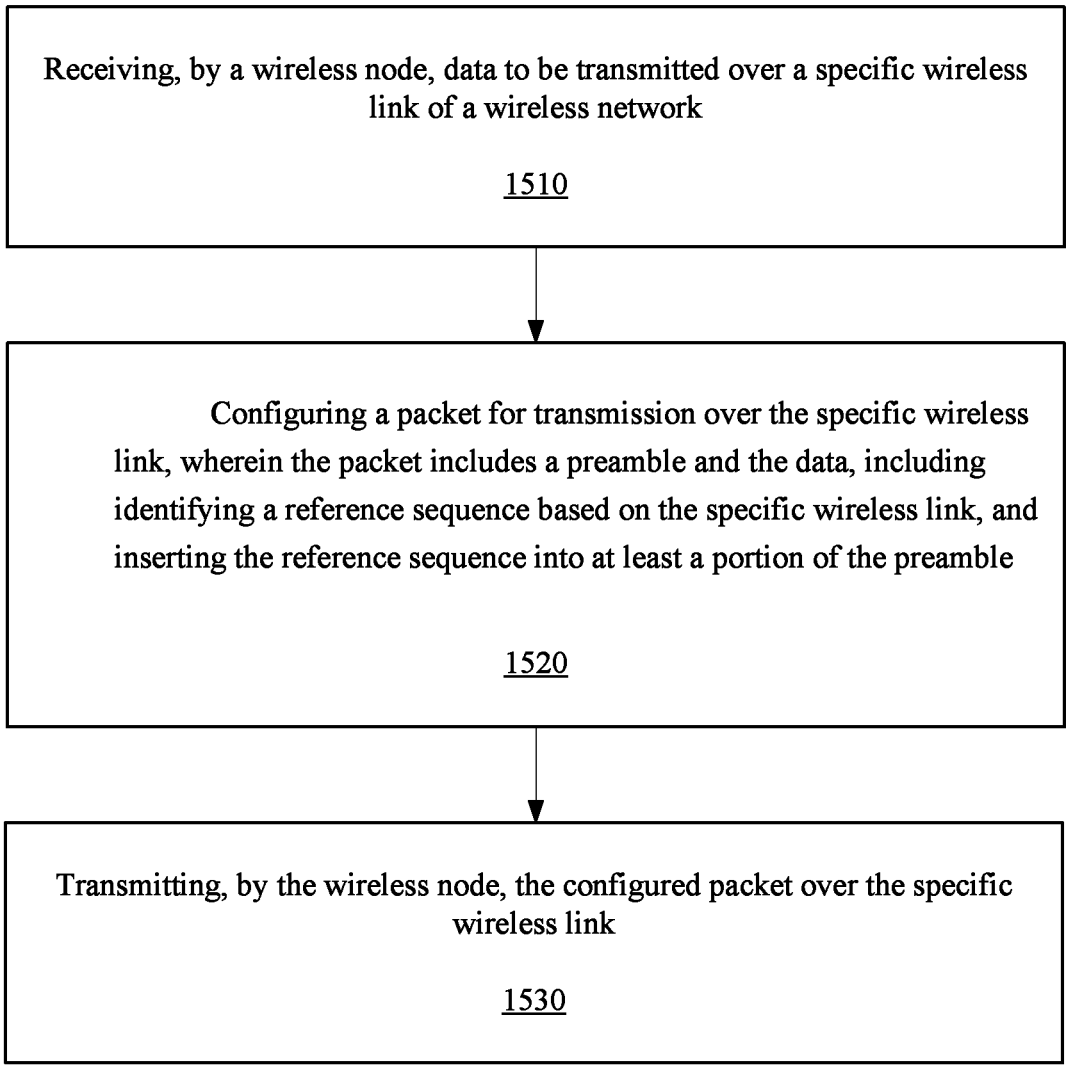
FIG. 15 is a flow chart that includes steps of a method of mitigating packet interference by inserting a reference sequence into a preamble of packets, according to an embodiment.

FIG. 15 is a flow chart that includes steps of a method of mitigating packet interference, according to an embodiment. A first step 1510 includes receiving, by a sector of a wireless node, data to be transmitted over a specific wireless link of a wireless network. For at least some embodiments, the wireless node includes a plurality of sectors. Any given sector may receive data for transmission through a specific link from another sector, or through a hardwire connection to the wireless node. For an embodiment, a link is defined as a wireless link between a wireless transmitting sector and a wireless receiving sector.

For an embodiment, the specific link includes a wireless link between two sectors of the wireless network. For an embodiment, a link (the specific link) is unidirectional. For broadcast packets, for an embodiment, a link (the specific link) is defined by a transmitter and multiple receivers.

A second step 1520 includes configuring a packet for transmission over the specific wireless link, wherein the packet includes a preamble and the data. For at least some embodiments, configuring the packet includes identifying a reference sequence based on the specific wireless link, and inserting the reference sequence into at least a portion of the preamble.

For at least some embodiments, identifying the reference sequence includes a central controller performing the selection of the references sequence, and providing the reference sequence to the sectors. That is, for an embodiment, the central controller performs the identifying of the reference sequence, and the central controller provides the reference sequence to the wireless node. For an embodiment, the reference sequences are predetermined by the central controller or some other backend controller during network planning and/or deployment. The reference sequence of a particular sector can be retrieved by the sector. For an embodiment, the sector performs the identifying of the reference sequence.

For an embodiment, the sector configures packets for multiple links, and inserts a reference sequence for each of the multiple links. For an embodiment, the reference sequence for a link (the specific link) can change over time.

A third step 1530 includes transmitting, by the wireless node, the configured packet over the specific wireless link.

For at least some embodiments, the references sequence includes a complex valued constituent base sequence. For an embodiment, the complex valued constituent base sequence includes a complementary sequence. For an embodiment, the complex valued constituent base sequence includes a Walsh code. For an embodiment, the complex valued constituent base sequence includes a pseudo random sequence. For an embodiment, the complex valued constituent base sequence includes a random complex sequence. For an embodiment, the complex valued constituent base sequence includes a Golay sequence.

Figure 16A:
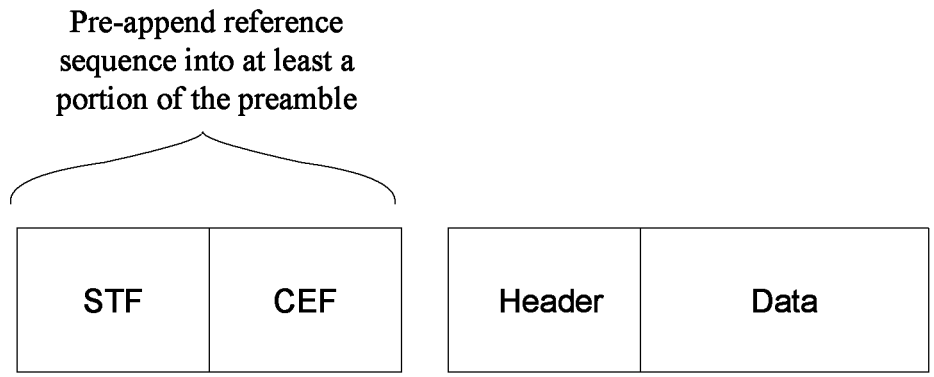
FIGS. 16A, 16B, 16C show processes for inserting reference sequences into packets, according to embodiments.
Figure 16B:
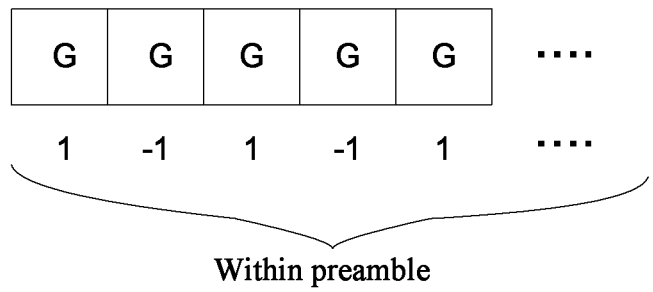
Figure 16C:
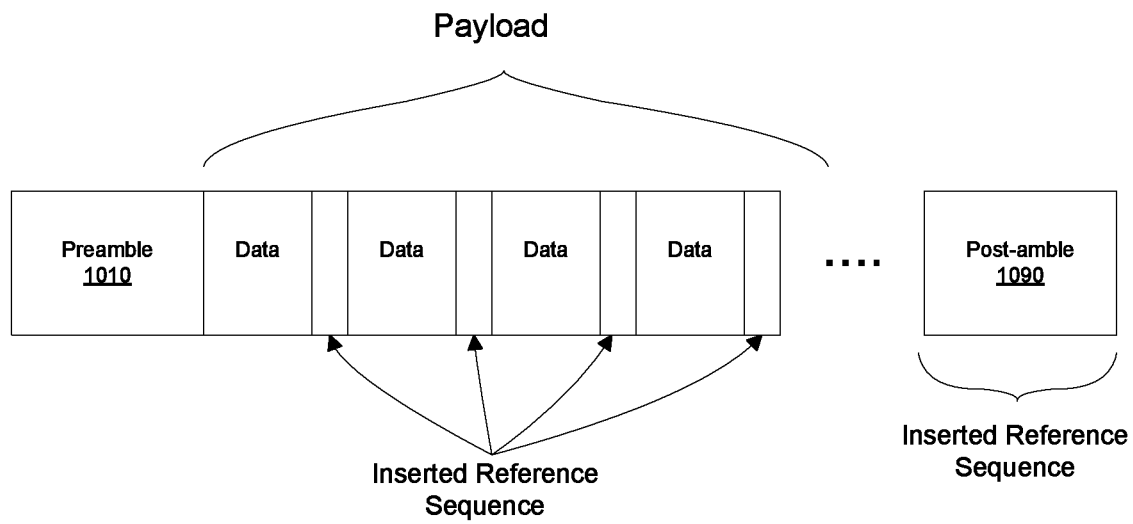

FIGS. 16A, 16B, 16C show processes for inserting reference sequences into packets, according to embodiments. FIG. 16A shows the reference sequence being inserted into at least the preamble of the packet. As shown, the packet includes an STF (short training field) and a CEF (channel estimate field). The reference sequence is inserted into at least a portion of these fields. For an embodiment, the reference sequence is pre-appended into the at least the portion of the preamble. The pre-appended reference sequence allows for a receiver to properly lock onto the packet earlier in the duration of the packet.

FIG. 16B shows a repeating of the insertion of the reference sequence within the preamble. The reference is designated with a G (Golay code). Further, for an embodiment, a phase of the reference sequence changes during the repetition of the reference sequence. For example, as shown, the phase alternates from Golay code to Golay code as indicated by the "1" and "−1". The alternating phase of the sequence as shown is merely an example. Other repeating sequences can alternatively be utilized.

FIG. 16C shows additional insertion of the reference sequence into the packet. For an embodiment, reference sequences are additionally inserted into data of a payload of the packets. Further, for an embodiment, the references sequence is additionally inserted into a post-able 1090 of the packet.

For at least some embodiments, identifying a reference sequence based on the specific wireless link includes characterizing interference between the specific link and at least one other link of the wireless network, and assigning the reference sequence to the specific link, and another sequence to the at least one other link of the wireless network. For at least some embodiments, identifying a reference sequence based on the specific wireless link, includes selecting a subset of codes from available codes, grouping links of the wireless network into a plurality of groups based on connectivity of the links between sectors of nodes of the wireless network, characterizing interference between at least one link of a first group of the plurality of groups and at least one link of a second group of the plurality of groups, wherein at least one of the first group or the second group includes the specific wireless link, assigning at least one code of the subset of codes to the first group and at least one other code of the subset of codes to the second group based on the characterizing of the interference, and configuring the sector with the references sequence, wherein the reference sequence comprises one of the subset of codes of the first group or one of the subset of codes of the second group based on which of the first group or the second group includes the specific wireless link.

Figure 17:
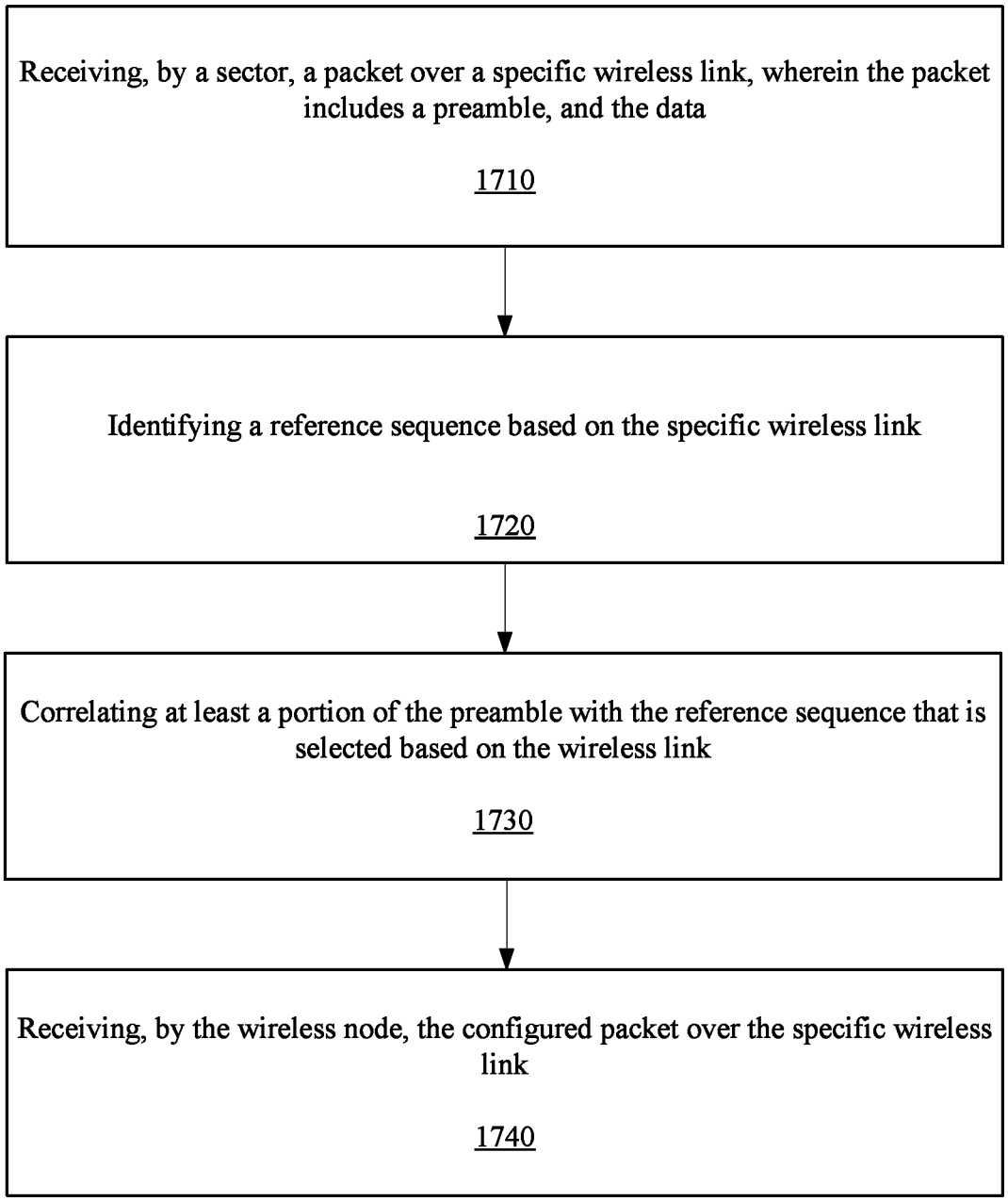
FIG. 17 is a flow chart that includes steps of a method of receiving a packet in which a reference sequence is inserted in a preamble of the packet, according to an embodiment.

FIG. 17 is a flow chart that includes steps of a method of receiving a packet in which a reference sequence is inserted in a preamble of the packet, according to an embodiment. A first step 1710 includes receiving, by a sector, a packet over a specific wireless link, wherein the packet includes a preamble, and the data. A second step 1720 includes identifying a reference sequence based on the specific wireless link. A third step 1730 includes correlating at least a portion of the preamble with the reference sequence that is selected based on the wireless link. A fourth step 1740 includes receiving, by the wireless node, the configured packet over the specific wireless link.

FIG. 18 shows test results of packet interference within a wireless network for different codes selections, according to an embodiment. A first table 1810 shows the number of early weak interferers for a sample network that has a total number of 3260 links and includes standard 801ad assignments. As depicted, the number of links with one early weak interferer is 134, the number of links with two early weak interferers is 62, and the number link with three early weak interferers is 1.

A second table 1820 shows the number of early weak interferers for the sample network that has a total number of 3260 links and includes link based and node based assignments using two Golay codes as reference sequences. As depicted, for the link-based assignments, the number of links with one early weak interferer is 65, the number of links with two early weak interferers is 1, and the number link with three early weak interferers is 0. As depicted, for the node-based assignments, the number of links with one early weak interferer is 66, the number of links with two early weak interferers is 4, and the number link with three early weak interferers is 0.

A third table 1830 shows the number of early weak interferers for the sample network that has a total number of 3260 links and includes link based and node based assignments using three Golay codes as reference sequences.

A fourth table 1840 shows the number of early weak interferers for the sample network that has a total number of 3260 links and includes link based and node based assignments using four Golay codes as reference sequences.

Figure 19:
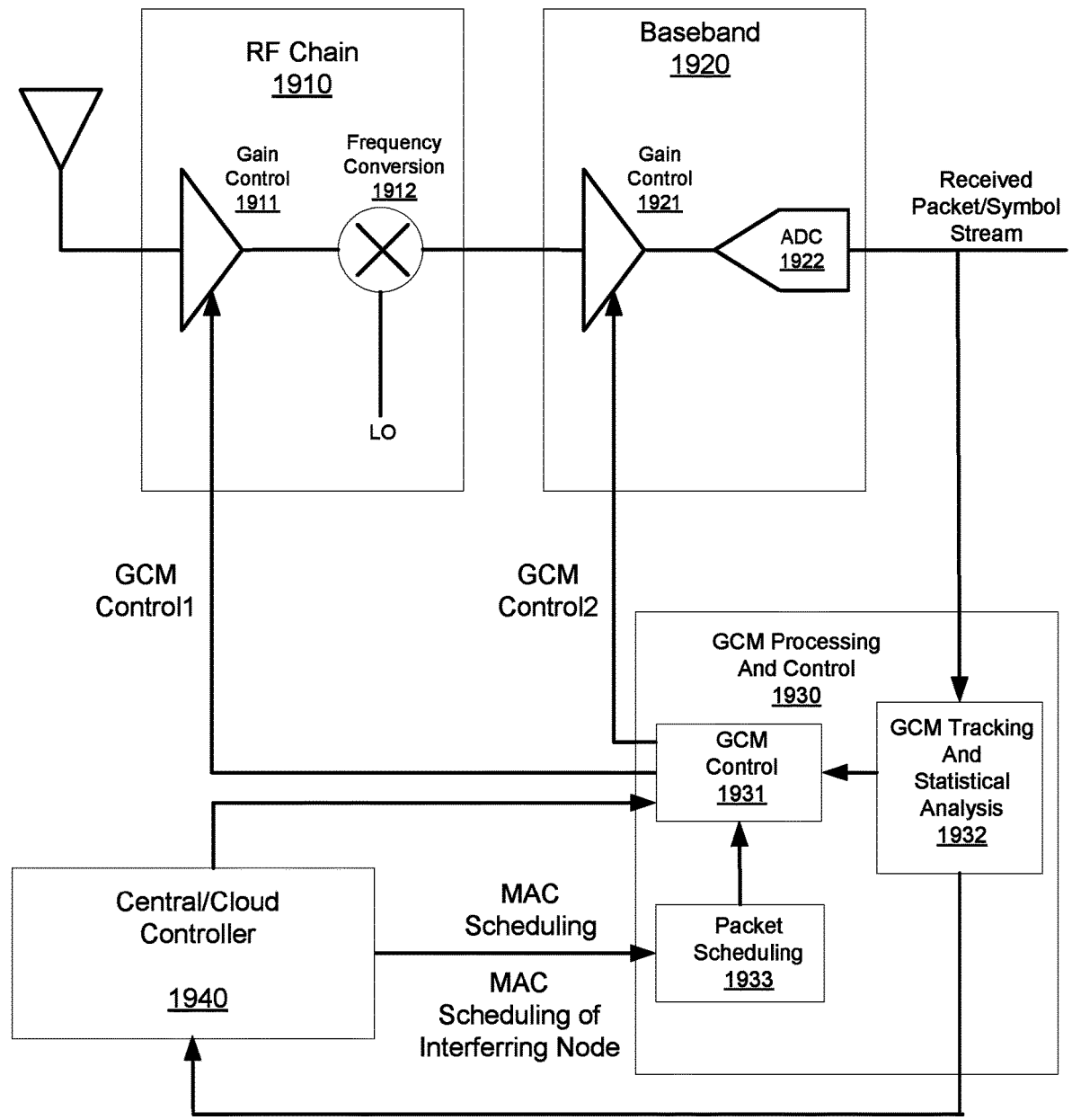
FIG. 19 shows a receiving node that includes received signal gain control, according to an embodiment.

FIG. 19 shows a receiving node that includes received signal gain control, according to an embodiment. For an embodiment, the receiving node is operative to facilitate a network-dependent gain control of signals received by the receiving node. At least some embodiments include utilizing gain control of the receiving node to mitigate the effects of early packet interference. FIG. 19 shows an RF (radio frequency) chain 1910 of a receiving node. As shown, the RF chain 1910 includes at least a GCM (gain control module) 1911 and a frequency converter 1912.

As shown, the receiving node further includes a baseband 1920. For at least some embodiments, the baseband 1920 includes at least a GCM 1921 and an ADC (analog to digital converter) 1922.

For an embodiment, the GCM control adaptively adjusts a gain of received signals to provide the baseband processing with a signal for processing with a semi-consistent amplitude signal. For at least some embodiments, the GCM selection is adjusted to a smaller gain with signals received with high signal power, and the GCM selection is adjusted to a larger gain for signals received with low signal power.

Figure 20:
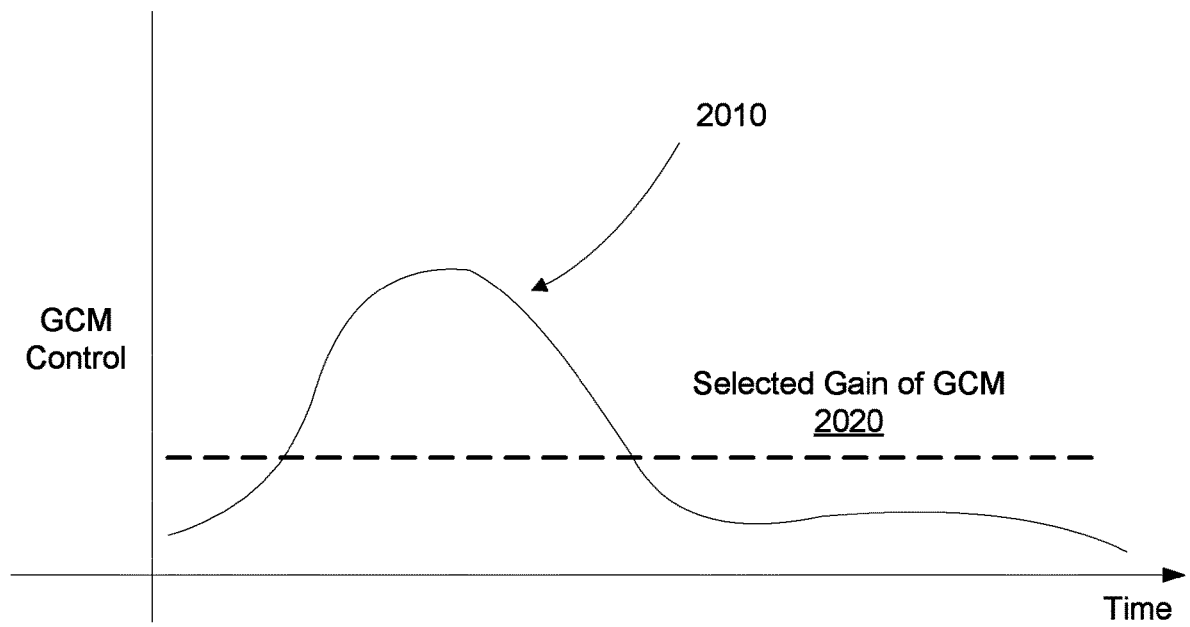
FIG. 20 is a plot that shows GCM (gain control module) selections over time, according to an embodiment.

FIG. 20 is a plot that shows GCM selections over time, according to an embodiment. High-levels of gain control indicate a received signal having a low signal amplitude or a low-power level, and low-levels of gain control indicate a received signal have large signal amplitude or high-power level.

For an embodiment, it is assumed that low-power received signals are more likely to be interference and high-power received signals are more likely to be the desired signals. Accordingly, monitoring the GCM in a free-running (gain not externally controlled) state can be used to select a set GCM level. For example, the GCM can be monitored over time to generate selected values of gain control over time, such as shown in FIG. 20. By selecting the GCM to be set (to, for example, the selected GCM 2020 of FIG. 20) the reception by the receiving node of an interfering signal or packet can be reduced. That is, monitoring of the selected GCM levels as depicted by the curve 2010 of FIG. 20 can be used to identify the timing of the reception of interfering packets as represented by the higher GCM gain selections. The GCM of the receiving node can be set to a selected GCM gain setting to reduce the reception by the receiving node of interfering signals because the GCM gain is selectively set too low for the interfering packets or signals to be received by the receiving node. For an embodiment, the GCM of the receiving node is adjustable, but the selected GCM gain is a maximum level of gain provided, That is, that selected GCM gain is a maximum gain setting of the GCM.

FIG. 19 shows possible GCM control (GCM control1, GCM control2) in either a GCM 1911 of the RF chain 1910 and/or GCM 1921 of the baseband 1920.

For an embodiment, a GCM tracking and statistical analysis block 1932 of FIG. 19 tracks and monitors the free-running GCM, and then selects control of the GCM (1931) based on the tracking and statistical analysis of the free-running GCM. For an embodiment, the tracking and statistical analysis includes periodically or adaptively (triggered) determining a base (GCM) gain that are selected for a plurality of received packets. A frequency distribution of the selected GCM gains is analyzed and a GCM gain is selected (as either a fixed gain or a maximum gain) is selected at a lower end (less than a threshold) of the frequency distribution. For at least some embodiments, an external central/cloud controller 1940 performs at least some of the monitoring, statistical analysis, and selection of the GCM control.

Further, for at least some embodiments, the GCM control 1931 is additionally or alternatively controlled based on scheduling of the transmission and reception of packets (1933) between transmitting and receiving nodes. For example, based on scheduling of packet transmission provided by a MAC (media access control) of the external central/cloud controller 1940, the receiving nodes can selectively reduce the GCM to mitigate the reception of interfering packets. That is, the scheduling provides timing of when desired packets are to be received by the receiving node. The receiving node can reduce the GCM before the times in which desired packets are to be received, thereby reducing the possibility of inadvertently receiving interfering packets. The GCM is then increased for reception of the desired packets, wherein the timing of the GCM increase is based on the scheduling of the desired packets.

Further, for at least some embodiments, the external central/cloud controller 1940 further provides scheduling (for example, MAC scheduling) of the transmission of packets by the interfering node. Accordingly, the external central/cloud controller 1940 can indicate to the receiving node the timing in which the interfering node is to transmit potentially interfering packets. Accordingly, the GCM can be reduced based on the timing of the scheduled transmission of potentially interfering packets, thereby reducing the chances the receiving node with receive the interfering packets.

Figure 21:
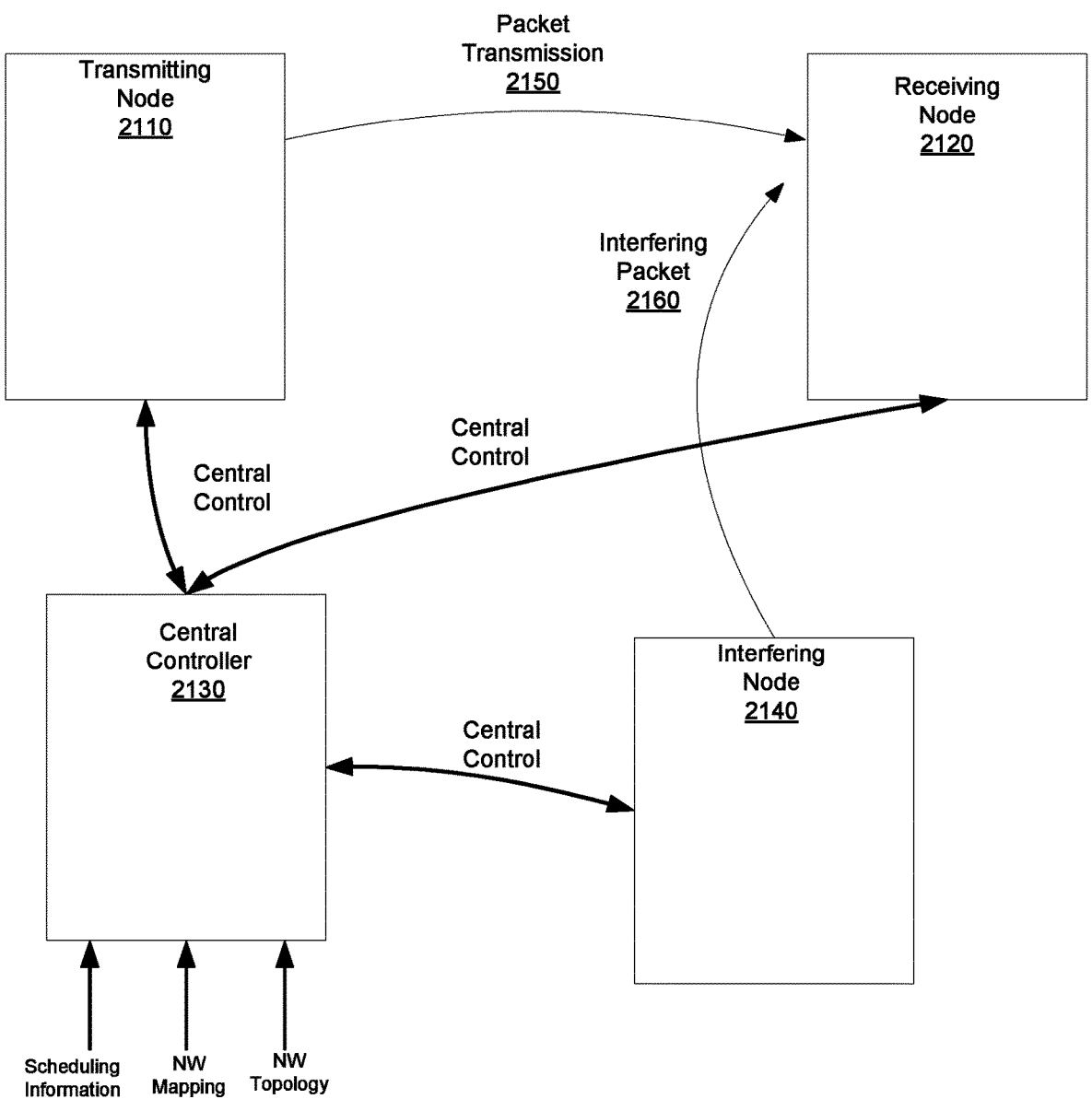
FIG. 21 shows a transmitting node, a receiving node, an interfering node, and a central controller, according to an embodiment.

FIG. 21 shows a transmitting node 2110, a receiving node 2120, an interfering node 2140, and a central controller 2130, according to an embodiment. For at least some embodiments, the central controller receives various network parameters, and adjusts the gain of the GCM of the receiving node to mitigate the reception of interfering packets. For an embodiment, the central controller 2130 receives NW (network) mapping information that allows for a determination of interfering nodes. For an embodiment, the central controller 2130 receives NW topology information that allows for a determination of interfering nodes.

For an embodiment, the central controller 2130 controls the transmission of training signal between the transmitting node 2110 and the receiving node 2120. Further, for an embodiment, the central controller 2130 controls the transmission of training signal between the interfering node 2140 and the receiving node 2120, thereby allowing a characterization of interference between the interfering node 2140 and the receiving node 2120.

For at least some embodiments, the central controller 2130 uses any combination of the NW mapping information, the NW topology information, training information of the transmission channel between the transmitting node 2110 and the receiving node 2120, or training information of the transmission channel between the interfering node 2140 and the receiving node 2120.

For an embodiment, the central controller 2130 provides scheduling (for example, MAC (media access control)) for the transmission of packets by the transmitting node 2110 and reception of packets by the receiving node 2120. For an embodiment, the receiving node 2120 reduces the GCM before the scheduled timing of the reception of the desired packets in order to reduce the possibility of reception of interfering packets. Further, the central controller 2130 provides an indicator to the receiving node of when the central controller 2130 has scheduled the interfering node 2140 to transmit potentially interfering packets. Accordingly, the receiving node reduces the GCM during the scheduled timing of the potentially interfering packets to reduce the possibility of the receiving node inadvertently receiving the interfering packets at the expense of reception of the desired packets. As stated, for an embodiment, the central controller 2130 provides scheduling of packet transmission of the transmitting node, the receiving node, and interfering nodes. Further, the central controller 2130 can aid in the determination and characterization of interference between the nodes. That is, the central controller 2130 can monitor interference between nodes and aid in the identification of which nodes interfere with other nodes. Based on the interference determinations, the central controller 2130 can provide GCM control as described above to mitigate the effects of packet interference.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on a computer storage medium for execution by, or to control the operation of, a data processing apparatus.

A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium also can be, or can be included in, one or more separate physical components or media (e.g., multiple CDs, disks, or other storage devices). The operations described in this specification can be implemented as operations performed by a data processing apparatus on data stored on one or more computer-readable storage devices or received from other sources.

The term "processor" encompasses all kinds of apparatus, devices, and machines for processing data, including, for example, a programmable processor, a computer, a system on a chip, or multiple ones, or combinations, of the foregoing. The apparatus can include special-purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services and distributed computing and grid computing infrastructures.

A computer program (also known as a program, software, software application, script, or code) can be written in any form of programming language, including compiled or interpreted languages and declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special-purpose logic circuitry, e.g., an FPGA or an ASIC.

Processors suitable for the execution of a computer program include, for example, both general and special-purpose microprocessors and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic disks, magneto-optical disks, or optical disks. Devices suitable for storing computer program instructions and data include all forms of nonvolatile memory, media and memory devices, including, for example, semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special-purpose logic circuitry.

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. A method, comprising:
receiving, by a receiving node, a plurality of packets;
adjusting, by an adjustable gain amplifier of the receiving node, a power level of the received plurality of packets;
controlling, by a gain control module, a gain of the adjustable gain amplifier, thereby controlling the power level of the received plurality of packets;
monitoring, by a statistical analysis block, the controlled gain of the gain control module over a period of time, comprising monitoring the controlled gain while the gain control module is operating in a free-running mode without any external control for the period of time, wherein the gain of the adjustable gain amplifier is not fixed;
after the period of time, selecting, by a statistical analysis block, a maximum gain for the gain control module based on a distribution of the monitored controlled gain of the gain control module over the period of time, wherein the maximum gain is a maximum level of gain provided; and
controlling, by the gain control module, the gain of the adjustable gain amplifier based on the selected maximum gain.

2. The method of claim 1, further comprising:
predicting a timing of reception of interfering packets based on the monitoring of the controlled gain of the gain control module over the period of time.

3. The method of claim 2, wherein controlling the gain of the adjustable gain amplifier is additionally based on the identified timing of reception of the interfering packets and comprises setting the gain lower when reception of interfering packets is predicted and higher for when reception of desired packets is predicted.

4. The method of claim 3, wherein the gain of the adjustable gain amplifier is set for the maximum gain when reception of desired packets is predicted.

5. The method of claim 1, wherein during the free-running mode the gain control module continually adjusts the gain of the adjustable gain amplifier based on a received signal power of the received plurality of packets.

6. The method of claim 5, further comprising tracking the controlled gain of the gain control module over the period of time, generating a statistical analysis of the tracking, and controlling, by the gain control module, the gain of the adjustable gain amplifier based on the statistical analysis.

7. The method of claim 6, wherein the receiving node performs at least a part of the generating the statistical analysis of the tracking.

8. The method of claim 6, wherein an external controller performs at least a part of the generating the statistical analysis of the tracking.

9. The method of claim 1, further comprising further controlling, by the gain control module, the gain of the adjustable gain amplifier based on scheduling of transmitted packets.

10. The method of claim 9, further comprising receiving, by the receiving node, the scheduling of transmitted packets from an external controller.

11. A node comprising:
an RF (radio frequency) chain including a receiver to receive a plurality of packets;
an adjustable gain amplifier of the RF chain operative to adjust a power level of the received plurality of packets;
a processor; and
a memory for storing program instructions that are executable by the processor to:
operate a gain control module to control a gain of the adjustable gain amplifier, thereby controlling the power level of the received plurality of packets;
monitor the controlled gain of the gain control module over a period of time, comprising monitoring the controlled gain while the gain control module is operating in a free-running mode without any external control for the period of time, and wherein the gain of the adjustable gain amplifier is not fixed;
after the period of time, select a maximum gain for the gain control module based on a distribution of the monitored controlled gain of the gain control module over the period of time, wherein the maximum gain is a maximum level of gain provided;
control the gain of the adjustable gain amplifier based on the selected maximum gain.

12. The node of claim 11, wherein a timing of reception of interfering packets is predicted based on the monitoring of the controlled gain of the gain control module over the period of time.

13. The node of claim 12, wherein controlling the gain of the adjustable gain amplifier is additionally based on the identified timing of reception of the interfering packets and comprises setting the gain lower when reception of interfering packets is predicted and higher for when reception of desired packets is predicted.

14. The node of claim 13, wherein the gain of the adjustable gain amplifier is set for the maximum gain when reception of desired packets is predicted.

15. The node of claim 11, wherein during the free-running mode the gain control module continually adjusts the gain of the adjustable gain amplifier based on a received signal power of the received plurality of packets.

16. The node of claim 15, further comprising tracking the controlled gain of the gain control module over the period of time, generating a statistical analysis of the tracking, and controlling, by the gain control module, the gain of the adjustable gain amplifier based on the statistical analysis.

17. The node of claim 16, wherein the receiving node performs at least a part of the generating the statistical analysis of the tracking.

18. The node of claim 16, wherein an external controller performs at least a part of the generating the statistical analysis of the tracking.

19. The node of claim 11, wherein the gain control module further operates to control the gain of the adjustable gain amplifier based on scheduling transmitted packets.

20. The node of claim 19, wherein the receiving node receives the scheduling transmitted packets from an external controller.

* * * * *